United States Patent
Kamata et al.

(10) Patent No.: US 11,283,072 B2
(45) Date of Patent: *Mar. 22, 2022

(54) TRANSITION METAL COMPOSITE HYDROXIDE PARTICLES AND PRODUCTION METHOD THEREOF, CATHODE ACTIVE MATERIAL FOR NON-AQUEOUS ELECTROLYTE RECHARGEABLE BATTERY AND PRODUCTION METHOD THEREOF, AND NONAQUEOUS ELECTROLYTE RECHARGEABLE BATTERY

(71) Applicant: SUMITOMO METAL MINING CO., LTD., Tokyo (JP)

(72) Inventors: Yasutaka Kamata, Ehime (JP); Taira Aida, Ehime (JP); Hiroyuki Toya, Ehime (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 255 days.

This patent is subject to a terminal disclaimer.

(21) Appl. No.: 16/539,170

(22) Filed: Aug. 13, 2019

(65) Prior Publication Data

US 2020/0006770 A1 Jan. 2, 2020

Related U.S. Application Data

(62) Division of application No. 14/890,349, filed as application No. PCT/JP2014/062637 on May 12, 2014, now Pat. No. 10,424,787.

(30) Foreign Application Priority Data

May 10, 2013 (JP) ................................. 2013-100034

(51) Int. Cl.
*H01M 4/525* (2010.01)
*H01M 4/485* (2010.01)
(Continued)

(52) U.S. Cl.
CPC .......... *H01M 4/525* (2013.01); *C01G 53/006* (2013.01); *C01G 53/04* (2013.01); *C30B 1/04* (2013.01);
(Continued)

(58) Field of Classification Search
CPC ... C01G 53/006; C01G 53/04; C01P 2004/03; C01P 2004/20; C01P 2004/50;
(Continued)

(56) References Cited

U.S. PATENT DOCUMENTS 6,255,020 B1 7/2001 Yamashita et al.
2009/0029253 A1 1/2009 Itou et al.
(Continued)

FOREIGN PATENT DOCUMENTS

EP 2720305 4/2014
JP 10-074517 A 3/1998
(Continued)

OTHER PUBLICATIONS

Office Action dated Jun. 21, 2017, from U.S. Appl. No. 14/890,349.
(Continued)

*Primary Examiner* — Carlos Barcena
(74) *Attorney, Agent, or Firm* — Katten Muchin Rosenman LLP

(57) ABSTRACT

Transition metal composite hydroxide particles as a precursor to a cathode active material for use in a non-aqueous electrolyte rechargeable battery, where the transition metal composite hydroxide has secondary particles formed by an aggregation of plate-shaped primary particles and fine primary particles, are described. The secondary particles have (Continued)

a center section formed by the plate-shaped primary particles, a layered structure with a low-density section formed by the fine primary particles, and a high-density section formed by the plate-shaped primary particles on the outside of the center section. The average value of the ratio of the center section outer diameter to the particle size of the secondary particles is 30% to 80%, and the average value of the ratio of the high-density section radial direction thickness to the particle size of the secondary particles is 5% to 25%.

14 Claims, 3 Drawing Sheets

(51) Int. Cl.
|  |  |
|---|---|
| *H01M 4/505* | (2010.01) |
| *H01M 10/052* | (2010.01) |
| *C01G 53/04* | (2006.01) |
| *C01G 53/00* | (2006.01) |
| *C30B 1/04* | (2006.01) |
| *C30B 1/10* | (2006.01) |
| *C30B 7/14* | (2006.01) |
| *C30B 29/10* | (2006.01) |
| *C30B 29/22* | (2006.01) |
| *H01M 4/02* | (2006.01) |

(52) U.S. Cl.
CPC .......... *C30B 1/10* (2013.01); *C30B 7/14* (2013.01); *C30B 29/10* (2013.01); *C30B 29/22* (2013.01); *H01M 4/485* (2013.01); *H01M 4/505* (2013.01); *H01M 10/052* (2013.01); *C01P 2004/03* (2013.01); *C01P 2004/20* (2013.01); *C01P 2004/50* (2013.01); *C01P 2004/51* (2013.01); *C01P 2004/61* (2013.01); *H01M 2004/028* (2013.01); *H01M 2220/20* (2013.01); *H01M 2220/30* (2013.01)

(58) Field of Classification Search
CPC .... C01P 2004/51; C01P 2004/61; C30B 1/04; C30B 29/10; C30B 29/22; C30B 7/14; H01M 2004/028; H01M 2220/20; H01M 2220/30; H01M 4/485; H01M 4/505; H01M 4/525

See application file for complete search history.

(56) References Cited

U.S. PATENT DOCUMENTS

| 2009/0035659 | A1 | 2/2009 | Takeuchi et al. |
| 2012/0270107 | A1 | 10/2012 | Toya et al. |
| 2012/0276454 | A1 | 11/2012 | Mori et al. |
| 2012/0282525 | A1 | 11/2012 | Nagai et al. |
| 2014/0011090 | A1 | 1/2014 | Toya et al. |
| 2014/0087263 | A1 | 3/2014 | Matsumoto et al. |
| 2014/0377660 | A1 | 12/2014 | Fukui et al. |

FOREIGN PATENT DOCUMENTS

| JP | 2004-253174 | A | 9/2004 |
| JP | 2008243448 | A | 10/2008 |
| JP | 2012-246199 | A | 12/2012 |
| JP | 2013147416 | A | 8/2013 |
| WO | 2011/067982 | A1 | 6/2011 |
| WO | 2011067937 | | 6/2011 |
| WO | 2012/131881 | A1 | 10/2012 |
| WO | 2012131881 | A1 | 10/2012 |
| WO | 2012/165654 | A1 | 12/2012 |
| WO | 2012/169274 | A1 | 12/2012 |
| WO | 2013/131881 | A1 | 9/2013 |

OTHER PUBLICATIONS

Non-Final Rejection dated Sep. 7, 2017, from U.S. Appl. No. 14/890,349.
Final Rejection dated Jul. 24, 2018, from U.S. Appl. No. 14/890,349.
Extended European Search Report dated Nov. 22, 2016, from the corresponding European Application No. 14794571.1.
International Search Report and Written Opinion dated Aug. 5, 2014, from the corresponding PCT/JP2014/062637.

TRANSITION METAL COMPOSITE HYDROXIDE PARTICLES AND PRODUCTION METHOD THEREOF, CATHODE ACTIVE MATERIAL FOR NON-AQUEOUS ELECTROLYTE RECHARGEABLE BATTERY AND PRODUCTION METHOD THEREOF, AND NONAQUEOUS ELECTROLYTE RECHARGEABLE BATTERY

TECHNICAL FIELD

The present invention relates to transition metal composite hydroxide particles and production method thereof, a cathode active material for a non-aqueous electrolyte rechargeable battery that uses these transition metal composite hydroxide particles as a precursor and production method thereof, and a non-aqueous electrolyte rechargeable battery that uses this cathode active material for a non-aqueous electrolyte rechargeable battery as cathode material.

BACKGROUND ART

In recent years, with the spread of portable electronic devices such as portable telephones, notebook computers and the like, there has been a strong demand for the development of compact, lightweight non-aqueous electrolyte rechargeable batteries that have a high energy density. Moreover, there is a strong demand for the development of high-output rechargeable batteries as the electrical power source for electric automobiles such as hybrid electric automobiles, plug-in hybrid electrical automobiles, and battery-powered electric automobiles.

As rechargeable batteries that can meet such demands, there are lithium-ion rechargeable batteries as one kind of a non-aqueous electrolyte rechargeable battery. A lithium-ion rechargeable battery has an anode, a cathode, an electrolyte and the like, and as an active material used in the anode and cathode, a material in which lithium can be absorbed or desorbed is used.

Among lithium-ion rechargeable batteries, lithium-ion batteries that use a layered or spinel type lithium transition metal composite oxide for the cathode material are able to obtain a 4V class voltage, so currently research and development of such batteries is actively being performed as batteries having a high energy density, and some have been put into practical use.

As the cathode material for such lithium-ion batteries, lithium cobalt composite oxide ($LiCoO_2$) for which the composition is comparatively simple, lithium nickel composite oxide ($LiNiO_2$) that uses nickel that is less expensive than cobalt, lithium nickel cobalt manganese composite oxide ($LiNi_{1/3}Co_{1/3}Mn_{1/3}O_2$), lithium manganese composite oxide ($LiMn_2O_4$) that uses manganese, lithium nickel manganese composite oxide ($LiNi_{0.5}Mn_{0.5}O_2$) and the like have been proposed.

In order to obtain a lithium-ion rechargeable battery having excellent cycling characteristics and output characteristics, it is necessary for the cathode active material to be constructed by particles having a small particle size and narrow particle size distribution. That is because, particles having a small particle size have a large specific surface area, and when used as a cathode active material, not only is it possible to sufficiently maintain the reaction surface area for reacting with the electrolyte, but it is also possible to make a thin cathode, and to shorten the migration length of lithium ions between the cathode and anode, so it is possible to reduce the cathode resistance. Moreover, for particles having a narrow particle size distribution, the voltage that is applied to the particles inside the electrode can be uniform, so it is possible to suppress a decrease in the battery capacity due to selective degradation of fine particles.

In order to further improve the output characteristics, making the structure of the cathode active material a hollow structure is effective. With this kind of cathode active material, it is possible to make the reaction surface area that reacts with the electrolyte larger than that of cathode active material having the same particle size and a solid structure, so it is possible to greatly reduce the cathode resistance.

Cathode active material is known to inherit the characteristics of the transition metal composite hydroxide particles of the precursor. In other words, in order to obtain the cathode active material described above, it is necessary to suitably control the particle size, the particle size distribution, and the specific surface area of the precursor transition metal composite hydroxide particles.

For example, JP 2012-246199 (A), JP 2013-147416 (A), and WO 2012/131881 disclose methods of producing transition metal composite hydroxide particles that become the precursor of cathode active material by a crystallization reaction that is clearly divided into two stages: a nucleation process that mainly performs nucleation, and a particle growth process that mainly performs particle growth. In these methods, the pH value of the reaction solution at a standard liquid temperature of 25° C. is controlled to be in the range 12.0 to 13.4 or 12.0 to 14.0 in the nucleation process, and in the range 10.5 to 12.0 in the particle growth process. Moreover, the reaction atmosphere is an oxidizing atmosphere in the nucleation process and at the beginning of the particle growth process, and at specified timing, is switched to a non-oxidizing atmosphere.

The transition metal composite hydroxide particles that are obtained by such methods have a small particle size and narrow particle size distribution, and has a low-density center section comprising fine primary particles, and a high-density outer shell section comprising plate-shaped or needle-shaped primary particles. Therefore, when such transition metal composite hydroxide particles are fired, the low-density center section contracts a large amount, and a hollow section is formed on the inside. As described above, the cathode active material inherits the particle characteristics of the composite hydroxide particles. More specifically, the cathode active material that is obtained by the technology that is disclosed in the above literature has an average particle size in the range of 2 μm to 8 μm, or 2 μm to 15 μm, an index [(d90−d10)/average particle size] that indicates the range of the particle size distribution of 0.60 or less, and the structure is a hollow structure. Therefore, in rechargeable batteries that use these cathode active materials, the capacity characteristics, output characteristics, and cycling characteristics are considered to be simultaneously improved.

However, the output characteristics of the rechargeable batteries that use these cathode materials cannot be said to be sufficiently improved. Particularly when considering usage as the power source of an electric automobile such as described above, it is necessary to further improve the output characteristics without impairing the capacity characteristics and cycling characteristics.

PATENT LITERATURE

[Patent Literature 1] JP 2012-246199 (A)
[Patent Literature 2] JP 2013-147416 (A)
[Patent Literature 3] WO 2013/131881

SUMMARY OF INVENTION

Problem to be Solved by Invention

In consideration of the problems described above, an object of the present invention is to provide a cathode active material that are able to simultaneously improve the capacity characteristics, the output characteristics and the cycling characteristics when constructing a rechargeable battery, and transition metal composite hydroxide particles being precursor of the cathode active material. Moreover, an object of the present invention is to provide a rechargeable battery that uses such a cathode active material. Furthermore, an object of the present invention is to provide a method for easily producing on an industrial scale such a cathode active material and transition metal composite hydroxide particles.

Means for Solving Problems

The production method for producing transition metal composite hydroxide particles of the present invention is a production method for producing transition metal composite hydroxide particles by a crystallization reaction to be a precursor for a cathode active material for a non-aqueous electrolyte rechargeable battery, having: a nucleation process for performing nucleation by controlling an aqueous solution for nucleation that includes a metal compound that includes at least a transition metal and an ammonium ion donor so that the pH value at a standard liquid temperature of 25° C. becomes 12.0 to 14.0; and a particle growth process for causing nuclei to grow by controlling an aqueous solution for particle growth that includes the nuclei that were obtained in the nucleation process so that the pH value is less than in the nucleation process and is 10.5 to 12.0.

Particularly, in the production method for producing transition metal composite hydroxide particles of the present invention, the reaction atmosphere in the nucleation process and at the beginning of the particle growth process is a non-oxidizing atmosphere in which the oxygen concentration is 5% by volume or less; and in the particle growth process, atmosphere control by which the reaction atmosphere is switched from a non-oxidizing atmosphere to an oxidizing atmosphere in which the oxygen concentration is greater than 5% by volume, and is then switched from that oxidizing atmosphere to a non-oxidizing atmosphere in which the oxygen concentration is 5% by volume or less is performed at least one time.

Preferably, in the particle growth process, the reaction atmosphere is switched from the non-oxidizing atmosphere to the oxidizing atmosphere at timing from the start of the particle growth process within a range of 5% to 35% of the overall particle growth process time.

Preferably, when the atmosphere control is performed only one time, the crystallization time in the oxidizing atmosphere in the particle growth process is 3% to 20% of the overall particle growth process time. On the other hand, when atmosphere control is performed two times or more, preferably, the total crystallization reaction time in the oxidizing atmosphere in the particle growth process is 3% to 30% of the total particle growth process time, and the crystallization reaction time during each oxidizing atmosphere is 1% or more of the total particle growth process time.

Preferably, the transition metal composite hydroxide particles are constructed by transition metal composite hydroxide particles that are expressed by the general expression (A): $Ni_xMn_yCo_zM_t(OH)_{2+a}$, where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element that is selected from among Mg, Ca, Al, Ti, V, Cr, Zr, Nb, Mo, Hf, Ta and W. In this case, a coating process for coating the transition metal composite hydroxide particles with a compound that includes the additional element M can be performed after the particle growth process.

The transition metal composite hydroxide particles of the present invention are transition metal composite hydroxide particles that are the precursor for cathode active material for a non-aqueous electrolyte rechargeable battery, having secondary particles that are formed by an aggregation of plate-shaped primary particles and fine primary particles that are smaller than the plate-shaped primary particles.

Particularly, the transition metal composite hydroxide particles of the present invention are such that the secondary particles have a center section that is formed by an aggregation of plate-shaped primary particles, and at least one layered structure on the outside of the center section of a low-density section that is formed by an aggregation of fine primary particles and a high-density section that is formed by an aggregation of plate-shaped primary particles; and the secondary particles have an average particle size of 1 μm to 15 μm, and an index [(d90−d10)/average particle size] that indicates the extent of the particle size distribution of 0.65 or less.

Preferably, when the layered structure is only one, the average value of the ratio of the center section outer diameter with respect to the particle size of the secondary particles is 30% to 80%. Moreover, in this case, preferably, the average value of the high-density section radial direction thickness with respect to the particle size of the secondary particles is 5% to 25%.

Preferably, the transition metal composite hydroxide particles are transition metal composite hydroxide particles that are expressed by the general expression (A): $Ni_xMn_yCo_zM_t(OH)_{2+a}$, where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element that is selected from among Mg, Ca, Al, Ti, V, Cr, Zr, Nb, Mo, Hf, Ta and W. In this case, preferably, the additional element M is uniformly distributed inside the secondary particles and/or coated on the surface of the secondary particles.

The production method for producing cathode active material for a non-aqueous electrolyte rechargeable battery of the present invention has: a mixing process for forming a lithium mixture by mixing the transition metal composite hydroxide particles with a lithium compound; and a calcination process for performing calcination of the lithium mixture formed in the mixing process at a temperature of 650° C. to 980° C. in an oxidizing atmosphere.

Preferably, in the mixing process, the lithium mixture is adjusted so that the ratio of the sum of the number of atoms of metals other than lithium included in the lithium mixture, and the number of atoms of lithium is 1:0.95 to 1.5.

Preferably, the production method for producing cathode active material for a non-aqueous electrolyte rechargeable battery further has a heat treatment process for heat treating the transition metal composite hydroxide particles at 105° C. to 750° C. before the mixing process.

Preferably, the cathode active material has layered hexagonal crystal lithium nickel manganese composite oxide particles that are expressed by the general expression (B): $Li_{1+u}Ni_xMn_yCo_zM_tO_2$, where $-0.05 \leq u \leq 0.50$, $x+y+z+t=1$, $0.3 \leq x \leq 0.95$, $0.05 \leq y \leq 0.55$, $\leq z \leq 0.4$, $0 \leq t \leq 0.1$, and M is one or more additional element that is selected from among Mg, Ca, Al, Ti, V Cr, Zr, Nb, Mo, Hf, Ta and W.

The cathode active material for a non-aqueous electrolyte rechargeable battery of the present invention has secondary particles that are formed by an aggregation of plural primary particles, wherein the secondary particles have a center section having solid or hollow structure, and at least a hollow section where there are no primary particles and an outer-shell section that is electrically connected to the center section on the outside of the center section. Moreover, preferably the secondary particles have an average particle size of 1 μm to 15 μm, and an index [(d90−d10)/average particle size] that indicates the extent of the particle size distribution of 0.7 or less.

Preferably, when the secondary particles have the center section, and the hollow section where there are no primary particles and the outer-shell section that is electrically connected to the center section on the outside of the center section, the average value of the ratio of the center section outer diameter with respect to the particle size of the secondary particles is 30% to 80%. In this case, preferably the average value of the ratio of the outer-shell section radial direction thickness is 5% to 25%.

Preferably, the cathode active material for a non-aqueous electrolyte rechargeable battery is such that the specific surface area is 0.7 $\mu m^2/g$ to 3.0 $m^2/g$.

Preferably, the cathode active material has layered hexagonal crystal lithium nickel manganese composite oxide particles that are expressed by the general expression (B): $Li_{1+u}Ni_xMn_yCo_zM_tO_2$, where −0.05≤u≤0.50, x+y+z+t=1, 0.3≤x≤0.95, 0.05≤y≤0.55, ≤z≤0.4, 0≤t≤0.1, and M is one or more additional element that is selected from among Mg, Ca, Al, Ti, V Cr, Zr, Nb, Mo, Hf, Ta and W.

The non-aqueous electrolyte rechargeable battery of the present invention has a cathode, an anode, a separator, and a non-aqueous electrolyte, wherein the cathode active material for a non-aqueous electrolyte rechargeable battery of the present invention is used as cathode material for the cathode.

Effect of Invention

With the present invention, it is possible to provide cathode active material and transition metal composite hydroxide particles that are a precursor thereof that is able to simultaneously improve capacity characteristics, output characteristics, and cycling characteristics when making a rechargeable battery. Moreover, with the present invention, it is possible to provide a rechargeable battery that uses this cathode active material. Furthermore, with the present invention, it is possible to provide a production method for easily producing the cathode active material and transition metal composite hydroxide particles of the present invention on an industrial scale. Therefore, the industrial meaning of the present invention is extremely large.

MODES FOR CARRYING OUT INVENTION

Figure 1:
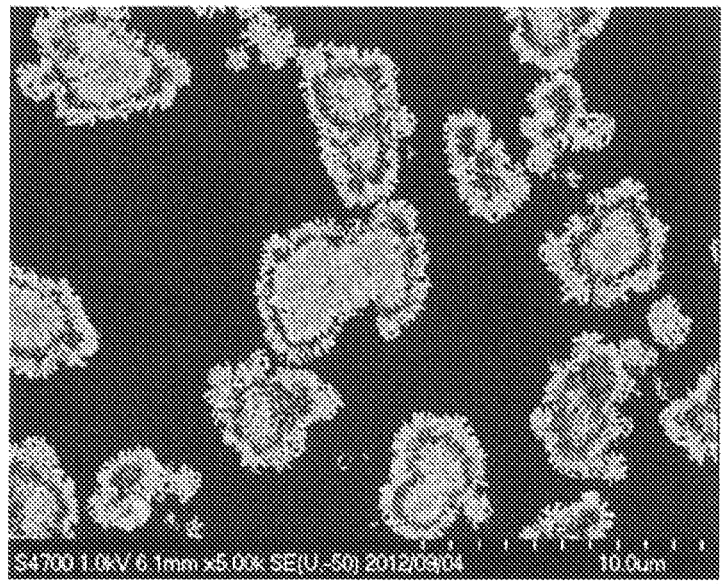
FIG. 1 is an FE-SEM photograph (observation magnification rate: 5,000×) of the cross section of transition metal composite hydroxide particles obtained in a first example.

The inventors diligently studied a cathode active material for a non-aqueous electrolyte rechargeable battery (hereafter, referred to as "cathode active material") that is capable of simultaneously improving the capacity characteristics, output characteristics, and cycling characteristics when used as the cathode material for a non-aqueous electrolyte rechargeable battery. As a result, it was learned that when producing transition metal composite hydroxide particles as a precursor to the cathode active material, by dividing the crystallization process into two stages: a nucleation process and a particle growth process, and by performing atmosphere control at least one time in which with the reaction atmosphere during the nucleation process and beginning of the particle growth process is a non-oxidizing atmosphere, and then in the particle growth process is switched from an non-oxidizing atmosphere to an oxidizing atmosphere, and then switched again to a non-oxidizing atmosphere, composite hydroxide particles having a small particle size and narrow particle size distribution, and having a layered structure in which a low-density section and high-density section are layered are obtained. Moreover, it was learned that when constructing a rechargeable battery that uses a cathode material having these composite hydroxide particles as a precursor, it is possible to greatly improve the output characteristics without impairing the capacity characteristics and cycling characteristics. The present invention was achieved based on this obtained knowledge.

1. Transition Metal Composite Hydroxide Particles
(1) Transition Metal Composite Hydroxide Particles The transition metal composite hydroxide particles of the present invention (hereafter, referred to as "composite hydroxide particles") have plural of secondary particles that are formed by an aggregation of plate shaped primary particles and fine primary particles that are smaller than the plate shaped primary particles. The secondary particles have a center section that is formed by an aggregation of plate shaped primary particles, and at least one layered structure in which a low-density section that is formed by an aggregation of fine primary particles and a high-density section that is formed by an aggregation of plate shaped primary particles are layered on the outside of the center section. Moreover, the secondary particles have an average particle size of 1 μm to 15 μm, and an index [(d90−d10)/average particle size] that indicates the extent of the particle size distribution of 0.65 or less.

(1-a) Particle Structure
[Secondary Particle Structure]

The composite hydroxide particles of the present invention have a center section that is formed by an aggregation of plate shaped primary particles, and at least one layered structure in which a low-density section and a high-density section are layered in an alternating manner on the outside of the center section. In the present invention, the low-density section means a portion that is formed by an aggregate of fine primary particles inside the secondary particles. Moreover, the high-density section means a portion that is formed by an aggregation of thick plate shaped primary particles that are larger than the fine primary particles inside the secondary particles.

By using such composite hydroxide particles as a precursor, it is possible to obtain a cathode active material having a layered structure in which a hollow section and an inner shell section or outer shell section are arranged in an alternating manner on the outside of a center section. In these composite hydroxide particles, the low-density section does not necessarily need to be formed over the entire outside of the center section, and can be partially formed on the outside of the center section. In that case, the cathode active material that is obtained has a structure in which a partial hollow section is formed on the outside of the center section, and an inner-shell section or outer-shell section is formed on the outside of the hollow section. Moreover, the center section of the composite hydroxide particles can also be such that plural secondary particles that are an aggregation of plate shaped primary particles are in a connected state. In that case, the structure is such that a hollow section and an inner-shell section or outer-shell section are formed on the outside of the center section of connected secondary particles.

[Fine Primary Particles]

The fine primary particles of the low-density section of composite hydroxide particles preferably have an average particle size of 0.01 µm to 0.3 µm, and more preferably, 0.1 µm to 0.3 am. When the average particle size of the fine primary particles is less than 0.01 µm, a low-density section having a sufficient size may not be formed. On the other hand, when the average particle size of the fine primary particles is greater than 0.3 µm, shrinkage during calcination will not progress in low-temperature areas, and the difference in shrinkage between the center section and high-density section will decreases, and there is a possibility that a hollow section having a sufficient size will not be formed in the cathode active material that is obtained.

The shape of such fine primary particles is preferably plate shaped and/or needle shaped. By using such a shape for the fine primary particles, it is possible to make the difference between the low-density section and the center section and high-density section sufficiently large, and it is possible to form a sufficiently large hollow section in the cathode active material that is obtained.

The average particle size of fine primary particles or plate shaped primary particles will be described later is found in the following way by impregnating composite hydroxide particles in resin and preparing the particles using a cross-section polisher so as to be able to observe the cross section, and then observing the cross section by using a scanning electron microscope (SEM).

First, the maximum diameters often or more fine primary particles or plate shaped primary particles that exist in the cross section of a secondary particles are measured and the average is found, then that value is taken to be the particle size of the fine primary particles or plate shaped primary particles in that secondary particle. Next, in the same way, the particle size is found for the fine primary particles or plate shaped primary particles for ten or more secondary particles. Finally, by calculating the average value of the particle sizes of the fine primary particles or plate shaped primary particles in these secondary particles, it is possible to find the average particle size of the fine primary particles and plate shaped primary particles.

[Plate Shaped Primary Particles]

The plate shaped primary particles of the center section and high-density section of the composite hydroxide particles preferably have an average particle size of 0.3 µm to 3 µm, and more preferably 0.4 µm to 1.5 µm, and even more preferably 0.4 µm to 1 µm. When the average particle size of the plate shaped primary particles is less then 0.3 µm, shrinkage during calcination begins in the low-temperature range, and the difference in shrinkage with the low-density section becomes small, so in the cathode active material that is obtained, it may not be possible to form a hollow section having a sufficient size. On the other hand, when the average particle size of plate shaped primary particles is greater than 3 µm, calcination must be performed at high temperature in order for sufficient crystallinity of the cathode active material that is obtained, and thus sintering occurs between secondary particles, which makes it difficult to control the average particle size and particle size distribution of the cathode active material so as to be within a specified range.

[Ratios of Outer Diameter of Center Section and Thickness in Radial Direction of Outer-Shell Section to Average Particle Size of Secondary Particles]

In the composite hydroxide particles of the present invention, the ratios of the outer diameter of the center section and the thickness in the radial direction of the high-density section with respect to the particle size of secondary particles is maintained in the cathode active material with these particles as a precursor. In other words, by suitably controlling the ratios of the outer diameter of the center section and the thickness in the radial direction of the high-density section with respect to the particle size of secondary particles in the stage of composite hydroxide particles, it is possible to make the structure of the cathode active material that is obtained more suitable.

For example, when the composite hydroxide particles (secondary particles) have only one layered structure, the average value of the ratio of the outer diameter of the center section with respect to the particle size of the secondary particles (hereafter, referred to as the "average ratio of the center section outer diameter") is preferably 30% to 80%, and more preferably 40% to 75%, and even more preferably 50% to 75%. When the average ratio of the center section outer diameter is less than 30%, there are problems in that electrical conduction between the center section and the outer-shell section becomes impossible in the cathode active material that is obtained, and the outer-shell section becomes excessively thick. On the other hand, when the average ratio of the center section outer diameter is greater than 80%, problems occur in the obtained cathode active material that a sufficient hollow section may not be formed or the outer-shell section will become excessively thin.

Moreover, when the composite hydroxide particles have only one layered structure, the average value of the ratio of the thickness in the radial direction of the high-density section (hereafter, referred to as the "average ratio of the high-density section radial direction thickness") is preferably 5% to 25%, and more preferably 5% to 20%, and even more preferably 5% to 15%. When the average ratio of the high-density section radial direction thickness is less than 5%, the amount of shrinkage of the composite hydroxide particles during calcination becomes excessively large, and not only does the strength of the cathode active material decrease, sintering occurs between secondary particles, and there is a possibility that the particle size distribution of the cathode active material that is obtained will worsen. However, when the average ratio of the high-density section radial direction thickness is greater than 25%, there is a possibility that a hollow section having a sufficient size will not be formed in the cathode active material that is obtained.

On the other hand, when the composite hydroxide particles have two or more layered structures, the average ratio of the center section outer diameter is preferably 20% to 70%, and more preferably 25% to 65%. Moreover, the average ratio of the high-density section radial direction thickness (total of thickness of plural high-density sections) is preferably 10% to 40%, and more preferably 15% to 35%. Furthermore, the average value of the thickness in the radial direction per one layer of high-density section with respect to the particle size of the secondary particles (hereafter, referred to as the "average ratio of thickness in the radial direction per one high-density section layer") is preferably 5% to 25%, and more preferably 5% to 20%. As a result, it is possible to form a sufficiently large hollow section in the cathode active material that is obtained even when the composite hydroxide particles have two or more layered structures.

When the composite hydroxide particles have only one layered structure, the average ratio of the center section outer diameter and the average ratio of the high-density section radial direction thickness can be found as described below using an SEM photograph of the a cross section of a secondary particle.

First, on a cross section SEM photograph, the thickness in the radial direction of the high-density section at three or more arbitrary positions per one particle is measured and the average value is found. Here, the thickness in the radial direction of the high-density section is the distance between two points where the distance from the outer perimeter of the secondary particles to the boundary between the high-density section and low-density section is a minimum. At the same time, the distance between two points where the distance on the outer perimeter of the center section is a maximum and the distance between two points where the distance on the secondary particles is a maximum are respectively measured, and that values are taken to be the outer diameter of the center section of the secondary particle and the particle size of the secondary particle. By dividing the outer diameter of the center section and the thickness in the radial direction of the high-density section by the particle size of the secondary particle, the ratios of the outer diameter of the center section and the ratio of the thickness in the radial direction of the particle size of the secondary particle with respect to the particle size of that secondary particle is found. Similar measurements are performed for ten or more secondary particles, and by finding the average value thereof, it is possible to find the average ratio of the center section outer diameter and the average ratio of the high-density section radial direction thickness.

On the other hand, when the composite hydroxide particles comprise two or more layered structures, except for measuring the thickness in the radial direction for each of the plural high-density sections, it is possible to find the average ratio of the center section outer diameter, the average ratio of the high-density section radial direction thickness, and average ratio of the thickness in the radial direction per one high-density section layer with respect to the particle size of the secondary particles.

(1-b) Average Particle Size

The composite hydroxide particles of the present invention are adjusted so that the average particle size of the secondary particles is 1 μm to 15 μm, and preferably 3 μm to 12 μm, and even more preferably 3 μm to 10 μm. The average particle size of the secondary particles correlates with the average particle size of the cathode active material that has the composite hydroxide particles as a precursor. Therefore, by controlling the average particles size of the secondary particles to be within this kind of range, it is possible to control the average particles size of the cathode active material that has the composite hydroxide particles as a precursor to be within a specified range.

In the present invention, the average particle size of the secondary particles means the volume-based average particle size (MV), and for example, can be found from the volume integrated value that is measured using a laser beam diffraction scattering type particle size analyzer.

(1-c) Particle Size Distribution

The composite hydroxide particles of the present invention are adjusted so that the index [(d90−d10)/average particle size] that indicates the extent of the particle size distribution is 0.65 or less, and preferably 0.55 or less, and even more preferably 0.50 or less.

The particle size distribution of the cathode active material is strongly affected by the precursor composite hydroxide particles. Therefore, when the composite hydroxide particles that include many fine particles and coarse particles are taken to be a precursor, the cathode active material will also include many fine particles and coarse particles, so it becomes impossible to sufficiently improve the safety, cycling characteristics and output characteristics of a rechargeable battery that uses that cathode active material. On the other hand, by adjusting the particle size distribution in the composite hydroxide particle stage so that [(d90−d10)/average particle size] becomes 0.65 or less, it becomes possible to make the particles size distribution of the cathode active material having the composite hydroxide particles as a precursor narrow, and it is possible to avoid the problem described above. However, in the case of production on an industrial scale, using composite hydroxide particles for which [(d90−d10)/average particle size] is excessively small is not practical. Therefore, taking cost and productivity into consideration, the lower limit for [(d90−d10)/average particle size] is preferably about 0.25.

Here, d10 is the particle size when the number of particles of each particle size are totaled starting from the smallest, and when that totaled volume becomes 10% of the total volume of all the particles, and d90 is the particle size when the number of particles are similarly totaled, and that totaled volume becomes 90% of the total volume of all the particles. The values for d10 and d90, can be found in the same way as the average particle size from the volume integrated value that was measured using a laser beam diffraction scattering type particle size analyzer.

(1-d) Composition

As long as the composite hydroxide particles of the present invention having the structure, average particle size and particle size distribution described above, the composition is not limited, however, preferably the composition of the composite hydroxide particles can be expressed by the general expression (A): $Ni_xMn_yCo_zM_t(OH)_{2+a}$, where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element that is selected from among Mg, Ca, Al, Ti, V, Cr, Zr, Nb, Mo, Hf, Ta and W. By using composite hydroxide particles such as this as a precursor, it is possible to easily obtain a cathode active material that can be expressed by a general expression (B) that will be described later, and so it is possible to achieve even higher battery characteristics.

In the composite hydroxide particles that are expressed by the general expression (A), the compositional range and the critical range of the nickel, manganese, cobalt and additional elements M of these particles are the same as that of the cathode active material that is expressed by the general expression (B). Therefore, an explanation of these will be omitted here.

(2) Production Method for Transition Metal Composite Hydroxide Particles

The method for producing the composite hydroxide particles of the present invention is a method of using a crystallization reaction to produce composite hydroxide particles that will be the precursor for the cathode active material, and has: a nucleation process of performing nucleation of an aqueous solution for nucleation that includes at least a metal compound that includes a transition metal and an ammonium ion donor by controlling the pH value at a standard liquid temperature of 25° C. to be 12.0 to 14.0; and a particle growth process of controlling an aqueous solution for particle growth that includes the nuclei that were obtained in the nucleation process so that the pH value becomes 10.5 to 12.0, which is lower than the pH value in the nucleation process, and causes the nuclei to grow. Particularly, in the production method for the composite hydroxide particles of the present invention, the atmosphere is controlled at least one time such that the reaction atmosphere during the nucleation process and beginning of the particle growth process is a non-oxidizing atmosphere in which the oxygen concentration is 5% by volume or less, and in the particle growth process, the reaction atmosphere is switched from a non-oxidizing atmosphere to an oxidizing atmosphere in which the oxygen concentration is greater than 5% by volume, after which the reaction atmosphere is further switched from an oxidizing atmosphere to a non-oxidizing atmosphere in which the oxygen concentration is 5% by volume or less.

As long as it is possible to achieve the particle structure, average particle size, and particle size distribution described above, the production method for the composite hydroxide particles of the present invention is not limited by the composition thereof, however, the method can be suitably applied to composite hydroxide particles that are expressed by the general expression (A).

(2-a) Crystallization Reaction

In the production method for the composite hydroxide particles of the present invention, the crystallization reaction is clearly divided into two stages: a nucleation process that mainly performs nucleation, and a particle growth process that mainly performs particle growth; and by adjusting the crystallization conditions in each process, and particularly by changing the reaction atmosphere at specified timing, it is possible to obtain composite hydroxide particles that have the particle structure, average particle size, and particle size distribution as described above. Moreover, the operation for adjusting the crystallization conditions is basically the same as in the conventional technology, so the production method for composite hydroxide particles of the present invention can be easily applied to production on an industrial scale.

[Nucleation Process]

In the nucleation process, first, the transition metal compound that will be the raw material in this process is dissolved in water, to form a raw material aqueous solution. In the production method for composite hydroxide particles of the present invention, the composition ratio of the composite hydroxide particles that are obtained is the same as the composition ratio of each metal in the raw material aqueous solution. At the same time, an alkali aqueous solution and an aqueous solution that includes an ammonium ion donor are supplied to and mixed in a reaction vessel, and thus forming a pre-reaction aqueous solution in which the pH value that is measure at a standard liquid temperature of 25° C. is 12.0 to 14.0, and the ammonium ion concentration is 3 g/L to 25 g/L. Moreover, the reaction atmosphere inside the reaction vessel is adjusted by introducing an inert gas to become a non-oxidizing atmosphere having an oxygen concentration of 5% by volume or less. The pH value of the pre-reaction aqueous solution can be measured by a pH meter, and the ammonium ion concentration can be measured by an ion meter.

Next, the raw material aqueous solution is supplied while stirring this pre-reaction aqueous solution. As a result, an aqueous solution for nucleation, which will be the reaction solution during the nucleation process, is formed in the reaction vessel. The pH value of this aqueous solution for nucleation is within the range described above, so in the nucleation process nucleation is preferentially performed with hardly any particle growth of nuclei. In the nucleation process, as nucleation proceeds the pH value of the nucleation aqueous solution and the ammonium ion concentration change. Therefore, it is necessary to supply alkali aqueous solution and ammonia aqueous solution as needed to keep the pH value of the liquid inside the reaction vessel within the range PH 12.0 to 14.0 at a standard liquid temperature of 25° C., and the ammonium ion concentration within the range 3 g/L to 25 g/L.

In the nucleation process, by supplying the raw material aqueous solution, and an aqueous solution that includes the alkali aqueous solution and ammonium ion donor to the aqueous solution for nucleation, new nuclei are continuously generated. The nucleation process is then ended as soon as a specified amount of nuclei have been generated in the aqueous solution for nucleation. At that time, the amount of nuclei generated can be determined from the amount of metal compound that is included in the raw material aqueous solution that was supplied to the aqueous solution for nucleation.

The amount of nuclei generated in the nucleation process is not particularly limited, however, in order to obtain composite hydroxide particles having a narrow particle size distribution, the amount is preferably 0.1 atomic % to 2 atomic %, and more preferably 0.1 atomic % to 1.5 atomic % with respect to the metal atoms in the metal compound that is included in the raw material aqueous solution that is supplied in the nucleation process and particle growth process.

[Particle Growth Process]

After the nucleation process, the pH value of the aqueous solution for nucleation inside the reaction vessel is adjusted to be 10.5 to 12.0 at a standard liquid temperature of 25° C., to form an aqueous solution for particle growth that will be the reaction aqueous solution during the particle growth process. Here, it is possible to adjust the pH value by stopping only the supply of alkali aqueous solution, however, from the aspect of obtaining composite hydroxide particles having a narrow particle size distribution, preferably the pH value is adjusted by stopping the supply of all aqueous solutions together. Adjustment of the pH value can be performed by supplying the same kind of inorganic acid as the acid of the metal compound of the raw material to the aqueous solution for nucleation; for example, by supplying sulfuric acid when using a sulfate as a raw material.

Next, the supply of the raw material aqueous solution is restarted while stirring this aqueous solution for particle growth. When doing this, the pH value of the aqueous solution for particle growth is in the range described above, so nuclei (particle) growth proceeds with hardly any new nuclei being generated, and composite hydroxide particles having a specified particle size are formed. Even during the particle growth process, as the particles grow the pH value of the aqueous solution for particle growth and the ammonium ion concentration changes, so it is necessary to keep the pH value and the ammonium concentration in the ranges above by appropriately supplying alkali aqueous solution and ammonia aqueous solution.

Particularly, in the production method for the composite hydroxide particles of the present invention, during the particle growth process, it is necessary to perform atmosphere control at least one time in which the reaction atmosphere is switched from a non-oxidizing atmosphere to an oxidizing atmosphere in which the oxygen concentration exceeds 5% by volume, after which the reaction atmosphere is switched from an oxidizing atmosphere to a non-oxidizing atmosphere in which the oxygen concentration is 5% by volume or less. As a result, it is possible to obtain composite hydroxide particles having the structure described above.

In a production method for composite hydroxide particles such as this, in the nucleation process and particle growth process, metal ions become nuclei or primary particles and precipitate out. Therefore, the ratio of the liquid component with respect to the metal component in the aqueous solution for nucleation and the aqueous solution for particle growth increases. As a result, the concentration of raw material aqueous solution decreases apparently, and particularly, in the particle growth process, there is a possibility that growth of composite hydroxide particles will stagnate. Therefore, in order to suppress an increase in the liquid component, preferably, after the end of the nucleation process and during the particle growth process, part of the liquid component of the aqueous solution for particle growth will be discharged to outside the reaction vessel. More specifically, preferably the supply and stirring of aqueous solution that includes the raw material aqueous solution, alkali aqueous solution, and ammonium donor is stopped, the nuclei and composite hydroxide particles in the aqueous solution for particle growth are caused to precipitate and settle, and the supernatant liquid of the aqueous solution for particle growth is discharged. As a result of this kind of operation, it is possible to increase the relative concentration of mixed aqueous solution in the aqueous solution for particle growth, so not only is it possible to prevent stagnation of particle growth and control the particle size distribution of the composite hydroxide particles that are obtained to be within a suitable range, it is also possible to improve the density of the overall secondary particles.

[Controlling Particle Size of Composite Hydroxide Particles]

The particle size of the composite hydroxide particles that are obtained as described above can be controlled by the time of the particle growth process or nucleation process, the pH value of the aqueous solution for nucleation or the aqueous solution for particle growth, and the amount of raw material aqueous solution that is supplied. For example, by making the pH value in the nucleation process a high value, or by making the time of the nucleation process long, it is possible to increase the amount of metal compound that is included in the raw material aqueous solution that is supplied and increase the amount of nuclei generated, and therefore it is possible to make the particle size of the composite hydroxide particles that are obtained small. On the other hand, by suppressing the amount of nuclei generated in the nucleation process, it is possible to make the particle size of the composite hydroxide particles that are obtained large.

[Another Form of Crystallization Reaction]

In the production method for composite hydroxide particles of the present invention, it is also possible to prepare a component adjusted aqueous solution that is separate from the aqueous solution for nucleation and in which the pH value and ammonium concentration have been adjusted to be suitable for the particle growth process, and add and mix the aqueous solution for nucleation after the nucleation process, and preferably the aqueous solution for nucleation after the nucleation process from which part of the liquid component has been removed, and then with this component adjusted aqueous solution, perform the particle growth process with this aqueous solution as the aqueous solution for particle growth.

In this case, it is possible to more distinctly separate the nucleation process and the particle growth process, so it is possible to perform control so that the reaction aqueous solution in each process is in an optimal state. Particularly, it is possible to perform control so that the pH value of the aqueous solution for particle growth is in an optimal range from the start of the particle growth process, and thus it is possible to make the particle size distribution of the composite hydroxide particles that will be obtained narrower.

(2-b) Supplied Aqueous Solutions

[Raw Material Aqueous Solution]

In the present invention, the ratio of metal elements in the raw material aqueous solution becomes the composition ratio of the composite hydroxide particles that are obtained. Therefore, it is necessary to suitably adjust raw material aqueous solution so that the amount of each metal that is included corresponds to the target composition of the composite hydroxide particles. For example, when trying to obtain composite hydroxide particles that are expressed by the general expression (A) above, the ratio of the metal elements in the raw material aqueous solution must be adjusted so that Ni:Mn:Co:<−x:y:z:t, where $x+y+z+t=1$, $0.3 \leq x \leq 0.95$, $0.05 \leq y \leq 0.55$, $0 \leq z \leq 0.4$, $0 \leq t \leq 0.1$.

The transition metal compound for adjusting the raw material aqueous solution is not particularly limited, however, from the aspect of ease of handling, preferably water soluble nitrates, sulfates, hydrochlorides and the like are used, and from the aspect of cost and preventing halogen from being mixed in, suitably using sulfates is particularly preferred.

Moreover, when an additional element M, where M is one or more additional element that is selected from among Mg, Ca, Al, Ti, V, Cr, Zr, Nb, Mo, Hf, Ta and W, is included in the composite hydroxide particles, preferably the compound for supplying the additional element is a similar water soluble compound; for example, it is possible to suitably use magnesium sulfate, calcium sulfate, aluminum sulfate, titanium sulfate, peroxititanic acid ammonium, titanium oxalate potassium, vanadium sulfate, ammonium vanadate chromium sulfate, potassium chromate, zirconium sulfate, niobium oxalate, ammonium molybdate, hafnium sulfate, sodium tantalate, sodium tungstate, ammonium tungstate, and the like.

The concentration of the raw material aqueous solution for the total metal compound is preferably 1 mol/L to 2.6 mol/L, and more preferably 1.5 mol/L to 2.2 mol/L. When the concentration of raw material aqueous solution is less than 1 mol/L, the amount of crystallization per reaction vessel decreases, so productivity decreases. On the other hand, when the concentration of mixed aqueous solutions exceeds 2.6 mol/L, the saturated concentration at normal temperature is exceeded, so crystals of each metal compound precipitate out again, and there is a possibility that the piping will become clogged.

The metal compounds described above do not absolutely need to be supplied to the reaction vessel as a raw material aqueous solution. For example, when performing a crystallization reaction in which a metal compound is used for which a compound other than the target compound is generated due to a reaction when mixed, it is possible to individually adjust the metal compound aqueous solutions so that the concentration of the total concentration of all of the metal compound aqueous solutions is within the range described above, and to supply the individual metal compound aqueous solutions to the reaction vessel at specified ratios.

Moreover, the amount of raw material aqueous solution supplied should be such that at the end of the particle growth process the concentration of the generated product material in the aqueous solution for particle growth is preferably 30 g/L to 200 g/L, and more preferably 80 g/L to 150 g/L. When the concentration of the product matter is less than 30 g/L, the aggregation of primary particles may be insufficient. However, when the concentration is greater than 200 g/L, a bias may occur in the particle growth without the metal salt aqueous solution for nucleation or the metal salt aqueous solution for particle growth being sufficiently diffused in the reaction vessel.

[Alkali Aqueous Solution]

The alkali aqueous solution that adjusts the pH value in the reaction aqueous solution is not particularly limited, and it is possible to use a typical alkali metal hydroxide aqueous solution such as sodium hydroxide, potassium hydroxide, and the like. It is possible to directly add the alkali metal hydroxide to the reaction aqueous solution, however, from the aspect of ease of pH control, preferably the alkali metal hydroxide is added as an aqueous solution. In that case, the concentration of the alkali metal hydroxide aqueous solution is preferably 20% by mass to 50% by mass, and more preferably 20% by mass to 30% by mass. By controlling the concentration of the alkali metal hydroxide aqueous solution so as to be within such a range, it is possible to prevent the pH value from becoming locally high at the location where added while suppressing the amount of solvent (amount of water) that is supplied to the reaction system, so it is possible to efficiently obtain composite hydroxide particles having a narrow particle size distribution.

As long as the pH value of the reaction aqueous solution does not become locally high, and is maintained within a specified range, the method for supplying the alkali aqueous solution is not particularly limited. For example, it is possible to supply the alkali aqueous solution using a pump such as a constant volume pump for which the amount of flow can be controlled while at the same time sufficiently stirring the reaction aqueous solution.

[Aqueous Solution Including Ammonium Ion Donor]

The aqueous solution that includes an ammonium ion donor is also not particularly limited, and for example, it is possible to use ammonia water or an aqueous solution of ammonium sulfate, ammonium chloride, ammonium carbonate, ammonium fluoride and the like.

When ammonia water is used as the ammonium ion donor, the concentration thereof is preferably 20% by mass to 30% by mass, and more preferably 22% by mass to 28% by mass. By regulating the concentration of ammonia water to be within such a range, it is possible to keep the loss of ammonia due to volatilization and the like to a minimum, and thus it is possible to improve productivity.

In the method for supplying an aqueous solution that includes an ammonium ion donor, as in the case of the alkali aqueous solution, it is possible to supply the aqueous solution using a pump for which the flow rate can be controlled.

(2-c) pH Value

In the production method for composite hydroxide particles of the present invention, it is necessary to control the pH value at a standard liquid temperature of 25° C. to be in the range 12.0 to 14.0 in the nucleation process, and in the range 10.5 to 12.0 in the particle growth process. In either process, the fluctuation range of the pH value during the crystallization reaction is preferably within ±0.2. When the fluctuation range of the pH value is large, the ratio of the amount of nucleation and particle growth is not constant, and it is difficult to obtain composite hydroxide particles having a narrow particle size distribution.

[Nucleation Process]

In the nucleation process, it is necessary to control the pH value of the reaction aqueous solution (aqueous solution for nucleation) at a standard liquid temperature of 25° C. so as to be within the range 12.0 to 14.0, and preferably 12.3 to 13.5, and more preferably 12.5 to 13.3. As a result, it is possible to suppress the growth of nuclei and to preferentially cause nucleation to occur, and the nuclei that are generated in this process are uniform and have a narrow particle size distribution. On the other hand, when the pH value is less than 12.0, the growth of the nuclei (particles) proceeds together with the generation of nuclei, so the particle size of the composite hydroxide particles that are obtained is not uniform, and the particle size distribution worsens. Moreover, when the pH value exceeds 14.0, the nuclei that are generated become very fine and minute, so there is a problem in that the aqueous solution for nucleation becomes gel like.

[Particle Growth Process]

In the particle growth process, it is necessary to control the pH value of the reaction aqueous solution (aqueous solution for particle growth) at a standard liquid temperature of 25° C. so as to be within the range 10.5 to 12.0, and preferably 11.0 to 12.0, and more preferably 11.5 to 112.0. As a result, it is possible to suppress the generation of new nuclei and to preferentially cause particle growth, and the composite hydroxide particles that are obtained are uniform and have a narrow particle size distribution. On the other hand, when the pH value is less than 10.5, the concentration of ammonium ions increases and the solubility of metal ions becomes high, so not only does the speed of the crystallization reaction become slow, but the amount of metal ions that remain in the reaction aqueous solution increases and productivity worsens. Moreover, when the pH value exceeds 12.0, the amount of nucleation during the particle growth process increases, the particle size of composite hydroxide particles that are obtained is not uniform, and the particle size distribution worsens.

When the pH value is 12.0, the reaction is at the boundary condition between nucleation and particle growth, so depending on the nuclei existing in the reaction aqueous solution, it is possible to determine whether the condition is for the nucleation process or the particle growth process. In other words, after increasing the pH value of the nucleation process to be greater than 12.0 and generating a large amount of nuclei, and then making the pH value 12.0 for the particle growth process, a large amount of nuclei exist in the reaction aqueous solution, so particle growth preferentially occurs, and it is possible to obtain composite hydroxide particles having a narrow particle size distribution. On the other hand, when the pH value of the nucleation process is made to be 12.0, there are no growing nuclei in the reaction aqueous solution, so nucleation preferentially occurs, and by making the pH value of the particle growth process less than 12.0, the generated nuclei grow and it is possible to obtain good composite hydroxide particles. In either case, control should be performed so that the pH value of the particle growth process is lower than the pH value of the nucleation process, and in order to clearly separate nucleation and particle growth, preferably the pH value of the particle growth process is lower than the pH value of the nucleation process by 0.5 or more, and more preferably 1.0 or more.

(2-c) Reaction Atmosphere

The structure of the composite hydroxide particles of the present invention is formed by controlling the pH value of the reaction aqueous solution in the nucleation process and the particle growth process as described above, and by controlling the reaction atmosphere in these processes. Therefore, in the production method for composite hydroxide particles of the present invention, controlling the pH value in each process, and controlling the reaction atmosphere have important significance. In other words, by controlling the pH value in each process as described above, and making the reaction atmosphere in the nucleation process and beginning of the particle growth process a non-oxidizing atmosphere, a center section in which plate-shaped primary particles are aggregated is formed. Moreover, by switching from a non-oxidizing atmosphere to an oxidizing atmosphere during the particle growth process, and then switching again to a non-oxidizing atmosphere, a layered structure of a low-density section in which fine primary particles are aggregated, and a high-density section in which plate-shaped primary particles are aggregated are formed on the outside of the center section.

In this kind of reaction atmosphere control, the fine primary particles of the low-density section are normally plate shaped and/or needle shaped, however, depending on the structure of the composite hydroxide particles, it is also possible to adopt a shape such as a rectangular parallelepiped shape, ellipsoidal shape, rhombus shape and the like. This is also the same for the primary particles of the center section and high-density section. Therefore, in the production method for composite hydroxide particles of the present invention, it is necessary to appropriately control the reaction atmosphere in each state according to the target structure of the composite hydroxide particles.

The method for controlling the reaction atmosphere is not particularly limited. For example, the reaction atmosphere can be controlled by allowing an atmospheric gas that corresponds to the reaction atmosphere of each stage to flow into the reaction vessel, or by that atmospheric gas bubbling in the reaction aqueous solution.

[Non-Oxidizing Atmosphere]

In the production method of the present invention, the reaction atmosphere in the stage of forming the center section and the high-density section of composite hydroxide particles must be controlled to be a weak oxidizing atmosphere or non-oxidizing atmosphere. More specifically, it is necessary to control the mixed atmosphere of oxygen and inert gas so that the oxygen concentration in the reaction atmosphere is 5% by volume or less, and preferably 2% by volume or less, and more preferably 1% by volume or less. As a result, unnecessary oxidation is suppressed, and it is possible to cause the nuclei that were generated in the nucleation process to grow to a fixed range, so it is possible for the center section and high-density section of composite hydroxide particles to comprise an aggregation of plate-shaped primary particles having an average particle size of 0.3 μm to 3 μm, and a narrow particle size distribution.

[Oxidizing Atmosphere]

On the other hand, in the stage of forming the low-density section of composite hydroxide particles of the present invention, it is necessary to control the reaction atmosphere to be an oxidizing atmosphere. More specifically, it is necessary to perform control so that the oxygen concentration in the reaction atmosphere is greater than 5% by volume, and preferably 10% by volume or more, and more preferably becomes an air atmosphere (oxygen concentration: 21% by volume). By controlling the oxygen concentration in the reaction atmosphere to be within this range, particle growth is suppressed, and the average particle size of primary particles is controlled to be within the range of 0.01 μm to 0.3 μm, so it is possible to form a low-density section having a density that is sufficiently different than that of the center section and high-density section described above.

The upper limit of the oxygen concentration in the reaction atmosphere in this state is not particularly limited, however, when the oxygen concentration is excessively high, the average particle size of the primary particles becomes less than 0.01 μm, and the low-density section may not become sufficiently large. Therefore, preferably the oxygen concentration is 30% by volume or less.

[Switching of Reaction Atmosphere]

In the particle growth process, atmosphere control described above must be performed at suitable timing so that composite hydroxide particles having the target particle structure are formed.

For example, when atmosphere control is performed only one time in trying to obtain composite hydroxide particles that have a center section, a low-density section and a high-density section, and an average ratio of the outer diameter of the center section with respect to the particle size of the secondary particles that is within the range 30% to 80%, it is necessary to switch from a non-oxidizing atmosphere to an oxidizing atmosphere at a point that is within the range 5% to 35%, and preferably 10% to 30% of the entire particle growth process time from the start the particle growth process.

Moreover, similarly, when atmosphere control is performed only one time in trying to obtain composite hydroxide particles that have a center section, a low-density section and a high-density section, and an average ratio of the high-density section radial direction thickness with respect to the particle size of the secondary particles that is within the range 5% to 25%, it is necessary to make the crystallization reaction time in the oxidizing atmosphere 3% to 20%, and preferably 3% to 15% with respect to the overall particle growth process time.

On the other hand, when atmosphere control described above is performed two times in trying to obtain composite hydroxide particles that have a center section, and plural low-density sections and high-density sections, it is necessary to make the overall crystallization time in the oxidizing atmosphere in the particle growth process with respect to the overall particle growth process time 3% to 30%, and preferably 5% to 25%, and make the crystallization reaction time in each oxidizing atmosphere with respect to the overall particle growth process time, 1% or more, and preferably 2% to 15%.

When the overall crystallization reaction time in the oxidizing atmosphere is less than 3% of the overall particle growth process time, it may not be possible to form a sufficiently large hollow section in the cathode active material that uses these composite hydroxide particles as a precursor. On the other hand, when the overall crystallization reaction time in the oxidizing atmosphere is greater than 30% of the overall particle growth process time, a problem with strength may occur in that the thickness of the inner-shell section or outer-shell section of the cathode active material may become excessively thin.

Moreover, when the crystallization reaction time in each oxidizing atmosphere is less than 1% with respect to the overall particle growth process time, it may not be possible to form a sufficiently large low-density section.

(2-d) Ammonium Ion Concentration

The ammonium ion concentration in the reaction aqueous solution is maintained at a constant value that is preferably within the range 3 g/L to 25 g/L, and more preferably 5 g/L to 20 g/L.

The ammonium ions in the reaction aqueous solution function as a complexing agent, so when the ammonium ion concentration is less than 3 g/L, the solubility of the metal ions cannot be kept constant, it becomes easy for the reaction aqueous solution to become gel like, and it becomes difficult to obtained complex hydroxide particles having a uniform shape and particle size. On the other hand, when the ammonium ion concentration is greater than 25 g/L, the solubility of metal ions becomes too large, so the amount of metal ions remaining in the reaction aqueous solution increases, which causes a change in the composition.

When the ammonium ion concentration during the crystallization reaction fluctuates, the solubility of metal ions fluctuates, so uniform composite hydroxides particles are not formed. Therefore, during the nucleation process and particle growth process, preferably control is performed so that the amount of fluctuation of the ammonium ions is within a fixed ranged, and more specifically, controlling the amount of fluctuation to ±5 g/L is preferred.

(2-e) Reaction Temperature

It is necessary that the temperature of the reaction aqueous solution (reaction temperature) be controlled throughout the nucleation process and particle growth process so as to be 20° C. or more, and more preferably to be within the range 20° C. to 60° C. A reaction temperature of less than 20° C. causes the solubility of the reaction aqueous solution to become low, and thus it becomes easy for nucleation to occur, and controlling the particle size and particle size distribution of the composite hydroxide particles that are obtained becomes difficult. The upper limit of the reaction temperature is not particularly limited, however, when the temperature exceeds 60° C., volatilization of ammonia is promoted, so the amount of aqueous solution that includes an ammonium ion donor that is supplied in order to keep the ammonium ions in the reaction aqueous solution within a fixed range increases, and thus the production cost increases.

(2-f) Coating Process

In the production method for composite hydroxide particles of the present invention, by adding compounds that include additional elements M to the raw material aqueous solution, it is possible to obtain composite hydroxide particles in which the additional elements M have been uniformly dispersed inside the particles. However, when trying to obtain the effect of adding additional elements M by adding a small amount, preferably a coating process is performed that will coat the surface of the obtained composite hydroxide particles after the particle growth process with a compound that includes the additional elements M.

The method of coating the composite hydroxide particles with a compound that includes additional elements M is not particularly limited. For example, it is possible to obtain composite hydroxide particles that have been uniformly coated with a compound that includes additional elements M by making a slurry of composite hydroxide particles, and controlling the pH value thereof to be within a specified range, and then adding an aqueous solution in which a compound that includes additional elements M have been dissolved (aqueous solution for coating), which causes the compound that includes the additional elements M to precipitate out on the surface of the composite hydroxide particles.

In this case, instead of an aqueous solution for coating, it is also possible to add an alkoxide solution of additional elements M to a slurry of composite hydroxide particles. Moreover, it is also possible to coat the composite hydroxide particles without making a slurry of composite hydroxide particles by spraying an aqueous solution or slurry in which a compound that includes additional elements M is dissolved onto the composite hydroxide particles. Furthermore, coating is also possible by using a method of spraying and drying a slurry in which a compound that includes composite hydroxide particles and additional elements M is suspended, or by using a method of mixing composite hydroxide particles and additional elements M in a solid-phase method.

When covering the surface of the composite hydroxide particles with additional elements M, it is necessary to appropriately adjust the composition of the raw material aqueous solution and the aqueous solution for coating so that the composition of the coated composite hydroxide particles will coincide with the composition of the target composite hydroxide particles. The coating process can also be performed on heat treated particles after heat treating the composite hydroxide particles.

(2-g) Production Equipment

In the production method for composite hydroxide particles of the present invention, preferably equipment such as a batch reaction vessel for a method in which the product is not recovered until the reaction is complete will be used. With such equipment the particles being grown and the overflow liquid are not recovered at the same time as in the case of a continuous crystallizer that recovers the product by an overflow method, so it is possible to easily obtain composite hydroxide particles having a narrow particle size distribution.

Moreover, in the production method for composite hydroxide particles of the present invention, it is necessary to control the reaction atmosphere during the crystallization reaction, so preferably equipment such as sealed equipment for which the atmosphere can be controlled is used. With such equipment, it is possible to appropriately control the reaction atmosphere in the nucleation process and particle growth process, so it is possible to easily obtain composite hydroxide particles having the particle structure described above and having a narrow particle size distribution.

2. Cathode Active Material for Non-Aqueous Electrolyte Rechargeable Battery (1) Cathode Active Material for a Non-Aqueous Electrolyte Rechargeable Battery The cathode active material of the present invention has secondary particles that are formed by an aggregation of plural primary particles, where the secondary particles have a center section with a solid structure or a hollow structure, and at least a hollow section in which there are no primary particles and an outer-shell section that is electrically connected with the center section on the outside of the center section. Moreover, the secondary particles have an average particle size of 1 μm to 15 μm, and an index [(d90−d10)/average particle size] that indicates the extent of the particle size distribution of 0.7 or less.

In the present invention, "having a center section with a solid structure or a hollow structure, and at least a hollow section in which there are no primary particles and an outer-shell section that is electrically connected with the center section on the outside of the center section" means that in addition to secondary particles that have a center section, a hollow section, and an outer-shell section, the secondary particles are also included in which there is at least one inner-shell section between the hollow section and the outer-shell section.

(1-a) Particle Structure

The cathode active material of the present invention has secondary particles that are formed by an aggregation of plural primary particles, and the secondary particles have a center section with a solid structure or a hollow structure, and at least a hollow section in which there are no primary particles and an outer-shell section that is electrically connected with the center section on the outside of the center section. In the cathode active material, the hollow section does not necessarily have to be formed in the entire area between the center section and the inner-shell section or outer-shell section, and can be partially formed in that area. Moreover, the center section can be formed by connecting plural secondary particles that are formed by an aggregation of primary particles.

In cathode active material having such particle structure, electrolyte penetrates inside the secondary particles by way of particle boundaries or gaps between the primary particles of the inner-shell section and outer-shell section, so desorption or absorption of lithium is possible on not only the surface of the outer-shell section, but also the surface of the inner-shell section and center section. Moreover, in this cathode active material, the inner-shell section and outer-shell section are electrically connected with the center section, so it is possible to make the resistance inside the particles sufficiently small. Therefore, when constructing a rechargeable battery that uses the cathode active material of the present invention, it is possible to greatly improve the output characteristics without impairing the capacity characteristics and cycling characteristics.

Furthermore, in the cathode active material of the present invention, by appropriately controlling the thickness of the each layer (center section, inner-shell section and outer-shell section) of the secondary particles, it is possible to reduce the distance that the lithium travels inside each layer, and thus further improve the output characteristics.

In the cathode active material of the present invention, when the secondary particles have a center section having a solid structure or hollow structure, and a hollow section in which there are no primary particles and an outer-shell section that is electrically connected with the center section on the outside of the center section, the average value of the ratio of the outer diameter of the center section with respect to the particle size of the secondary particles (hereafter, referred to as the "average ratio of the center section outer diameter") is preferably 30% to 80% and more preferably 40% to 75%, and even more preferably 50% to 75%. When the average ratio of the center section outer diameter is less than 30%, it becomes impossible to electrically connect the center section with the inner-shell section or outer-shell section, and the resistance inside the particles may increase. Moreover, the outer shell section becomes excessively thick, so the reaction surface area with the electrolyte may decrease. On the other hand, when the average ratio of the center section outer diameter is greater than 80%, the hollow section decreases, and it may not be possible to sufficiently maintain the reaction surface area with the electrolyte.

Furthermore, the outer-shell section becomes excessively thin, so the strength of the cathode active material may decrease remarkably.

Moreover, in this case, the average value of the ratio of the thickness in the radial direction of the outer-shell section with respect to the particle size of the secondary particles (hereafter, referred to as the "average ratio of the outer-shell section radial direction thickness") is preferably 5% to 25%, and more preferably 5% to 20%, and even more preferably 5% to 15%. When the average ratio of the outer-shell section radial direction thickness is less than 5%, the thickness of the outer-shell section becomes excessively thin, so the strength of the cathode active material decreases remarkably, and when producing a cathode for a rechargeable battery, the cathode active material may break down and fine powder occur. However, when the average ratio of the outer-shell section radial direction thickness exceeds 25%, the outer-shell section becomes excessively thick, and the reaction surface area with the electrolyte decreases, so the output characteristics may decrease.

On the other hand, when the cathode active material has at least one inner-shell section between the hollow section and the outer-shell section, the average ratio of the center section outer diameter is preferably 20% to 70%, and more preferably 25% to 65%. Moreover, the average value of the ratio of the total thickness in the radial direction of the inner-shell section and outer-shell section with respect to the particle size of the secondary particles (hereafter, referred to as the "average ratio of the inner-shell section and outer-shell section radial thickness") is preferably 10% to 35%, and more preferably 12% to 30%. Furthermore, the average value of the ratio of the thickness in the radial direction of per one inner-shell section layer with respect to the particle size of the secondary particles (hereafter, referred to as the "average ratio of the thickness in the radial direction per inner-shell section layer") and the average value of the ratio of the thickness in the radial direction of the outer-shell section (hereafter, referred to as the "average ratio of the outer-shell section radial thickness") is preferably 5% to 23%, and more preferably 5% to 18%. As a result, even when the cathode active material has at least one inner-shell section between the hollow section and the outer-shell section, it becomes possible to increase the reaction surface area with the electrolyte while maintaining the strength of the cathode active material.

The methods for finding the average ratio of the center section outer diameter, the average ratio of the inner-shell section and outer-shell section radial direction thickness, the average ratio of the radial direction thickness per one inner-shell section layer, and the average ratio of outer-shell section radial direction thickness are the same as for the composite hydroxide particles described above, so an explanation thereof will be omitted here.

(1-b) Average Particle Size

The cathode active material of the present invention is adjusted so that the average particle size is preferably 1 μm to 15 μm, and more preferably 3 μm to 12 μm, and even more preferably 3 μm to 10 μm. By making the average particle size of the cathode active material to be within such a range, not only does it become possible to increase the battery capacity per unit volume of a rechargeable battery that uses this cathode active material, but it is also possible to improve the safety characteristics and output characteristics. When the average particle size is less than 1 μm, the filling capability of the cathode active material decreases and it is not possible to increase the battery capacity per unit volume. On the other hand, when the average particle size is greater than 15 μm, the specific surface area of the cathode active material decreases, and the reaction surface area with the electrolyte decreases, so it becomes difficult to improve the output characteristics.

The average particle size of the cathode active material, as in the case of the composite hydroxide particles described above, means the volume-based average particle size (MV), and for example, can be found from the volume integrated value that is measured using a laser beam diffraction scattering type particle size analyzer.

(1-c) Particle Size Distribution

The cathode active material of the present invention has lithium composite oxide particles having a very narrow particle size distribution for which an index [(d90−d10)/ average particle size] that indicates the range of the particle size distribution is preferably 0.60 or less, and more preferably 0.55 or less. For such cathode active material, the percentage of fine particles and coarse particles is small, so a rechargeable battery that uses the cathode active material has excellent safety characteristics, cycling characteristics, and output characteristics.

On the other hand, when [(d90−d10)/average particle size] is greater than 0.70, the percentage of fine particles and coarse particles inside the cathode active material increases. For example, in the case of a rechargeable battery that uses a cathode active material having a large percentage of fine particles is used, heat is generated and safety characteristics decrease due to localized reaction of fine particles, and the fine particles selectively deteriorate, so the cycling characteristics become inferior. Moreover, in the case of a rechargeable battery that uses a cathode active material having a large percentage of coarse particles, it is not possible to sufficiently maintain the reaction surface area of the cathode active material with the electrolyte, and thus the output characteristics become inferior.

When presuming that production will be on an industrial scale, using a cathode active material having an excessively small [(d90−d10)/average particle size] index is not practical. Therefore, in consideration of cost and productivity, preferably the lower limit for the [(d90−d10)/average particle size] index is about 0.25.

The meaning of and method for finding d10 and d90 in [(d90−d10)/average particle size], which is an index indicating the extent of the particle size distribution, is the same as was described above for composite hydroxide particles, so an explanation here is omitted.

(1-d) Composition

The composition of the cathode active material of the present invention, having the structure described above is not particularly limited, however, composition that is expressed by the general expression (B): $Li_{1+u}Ni_xMn_yCo_zM_tO_2$, where $-0.05 \leq u \leq 0.50$, $x+y+z+t=1$, $0.3 \leq x \leq 0.95$, $0.05 \leq y \leq 0.55$, $0 \leq z \leq 0.4$, $0 \leq t \leq 0.1$, and M is one or more additional element that is selected from among Mg, Ca, Al, Ti, V Cr, Zr, Nb, Mo, Hf, Ta and W, can be suitably applied.

In this cathode active material, the value of u that indicates a surplus amount of Lithium (Li) is preferably −0.05 or more and 0.50 or less, and more preferably 0 or more and 0.35 or less. By regulating the value of u to be within the range above, it is possible to improve the output characteristics and capacity characteristics of a rechargeable battery that uses this cathode active material for the cathode material. When the value of u is less than −0.05, the cathode resistance of the rechargeable battery becomes large, so it is not possible to improve the output characteristics. On the other hand, when the value of u is greater than 0.50, not only does the initial discharge capacity decrease, but also the cathode resistance becomes large.

Nickel (Ni) is an element that contributes to increasing the electric potential and capacity of a rechargeable battery, and the value x that indicates the amount of nickel included is preferably 0.3 or more and 0.95 or less, and more preferably 0.3 or more and 0.9 or less. When the value of x is less than 0.3, it is not possible to improve the capacity of a rechargeable battery that uses this cathode active material. On the other hand, when the value of x is greater than 0.95, the amounts of the other elements included decrease, and the effects of those elements cannot be obtained.

Manganese (Mn) is an element that contributes to the improvement of thermal stability, and the value of y that indicates the amount of manganese included is preferably 0.05 or more and 0.55 or less, and more preferably is 0.10 or more and 0.40 or less. When the value of y is less than 0.05, it is not possible to improve the thermal stability of a rechargeable battery that uses this cathode active material. On the other hand, when the value of y is greater than 0.55, Mn elutes from the cathode active material during high-temperature operation, and the charge/discharge cycling characteristics become inferior.

Cobalt (Co) is an element that contributes to the improvement of the charge/discharge cycling characteristics, and the value z that indicates the amount of cobalt included is preferably 0 or more and 0.4 or less, and preferably is 0.10 or more and 0.35 or less. When the value of z is greater than 0.4, the initial discharge capacity of a rechargeable battery that uses this cathode active material greatly decreases.

In the cathode active material of the present invention, in order to further improve the durability and output characteristics of a rechargeable battery, it is also possible to include additional elements M in addition to the metal elements above. As such additional elements M, it is possible to use one or more kind that is selected from among magnesium (Mg), calcium (Ca), aluminum (Al), titanium (Ti), vanadium (V), chromium (Cr), zirconium (Zr), niobium (Nb), molybdenum (Mo), hafnium (Hf), tantalum (Ta), and tungsten (W).

The value of t that indicates the amount of additional elements M included is preferably 0 or more and 0.1 or less, and more preferably 0.001 or more and 0.05 or less. When the value t is greater than 0.1, the metal elements that contribute to the Redox reaction decrease, so the battery capacity decreases.

The additional elements M can be uniformly dispersed inside the particles of cathode active material, or can be coated on the surfaces of the particles of cathode active material. Furthermore, the additional elements can be coated on the surface of the particles after being uniformly dispersed inside the particles. In any case, the amount of additional elements included must be controlled so as to be within the range above.

Moreover, in the case of further improving the capacity characteristics of a rechargeable battery that uses the cathode active material, preferably the composition of the cathode active material is adjusted so as to be expressed by the general expression (B1): $Li_{1+u}Ni_xMn_yCo_zM_tO_2$, where $-0.05 \leq u \leq 0.20$, $x+y+z+t=1$, $0.7 \leq x \leq 0.95$, $0.05 \leq y \leq 0.1$, $0 \leq z \leq 0.2$, $0 \leq t \leq 0.1$, and M is one or more additional element that is selected from among Mg, Ca, Al, Ti, V, Cr, Zr, Nb, Mo and W. Particularly, when also achieving thermal stability, the value of x in the general expression (B1) is preferably $0.7 \leq x \leq 0.9$, and more preferably $0.7 < x \leq 0.85$.

On the other hand, when further improving the thermal stability, the composition of the cathode active material is preferably adjusted so as to be expressed by the general expression (B2): $Li_{1+u}Ni_xMn_yCo_zM_tO_2$, where $-0.05 \leq u \leq 0.50$, $x+y+z+t=1$, $0.3 \leq x \leq 0.7$, $0.1 \leq y \leq 0.55$, $\leq z \leq 0.4$, $0 \leq t \leq 0.1$, and M is one or more additional element that is selected from among Al, Ti, V, Cr, Zr, Nb, Mo, Hf, Ta and W).

(1-e) Specific Surface Area

The cathode active material of the present invention is such that the specific surface area is preferably 0.7 µm²/g to 3.0 µm²/g, and more preferably 1.0 µm²/g to 3.0 µm²/g. A cathode active material having a specific surface area that is within such a range, has a large reaction surface area with the electrolyte, and it is possible to greatly improve the output characteristics of a rechargeable battery that uses this cathode active material. In regard to this, when the specific surface area of the cathode active material is less than 0.7 µm²/g, it is not possible to maintain the reaction surface area with the electrolyte when constructing a rechargeable battery, so it becomes difficult to sufficiently improve the output characteristics. On the other hand, when the specific surface area of the cathode active material is greater than 3.0 m²/g, the reactivity with the electrolyte becomes too high, so the thermal stability may decrease.

The specific surface area of the cathode active material can be measured with a BET method using nitrogen gas adsorption.

(1-f) Tap Density

Increasing the capacity of a rechargeable battery in order to increase the amount of time that a portable electronic device can be used or increase the distance that an electric automobile can travel is becoming an important task. On the other hand, from the problem of packing or electron conductivity of the entire battery, there is a need to make the thickness of the electrodes of a rechargeable battery several microns thick. Therefore, not only is it necessary to use a cathode active material having a high capacity as the cathode active material, it is also necessary to increase the filling ability of the cathode active material and to increase the overall capacity of the rechargeable battery. From this aspect, in the cathode active material of the present invention, the tap density, which is an index of the filling ability, is preferably 1.0 g/cm³ or more and more preferably 1.3 g/cm³ or more. When the tap density is less than 1.0 g/cm³, the filling ability is low, and it may not be possible to sufficiently improve the overall capacity characteristics of the rechargeable battery. On the other hand, the upper limit for the tap density is not particularly limited, however, the upper limit under normal production conditions is about 3.0 g/cm³.

The tap density is the bulk density after tapping a powder sample that is collected in a vessel 1000 times according to JIS Z-2504, and can be measured using a shaking specific gravity measuring device.

(2) Production Method for Cathode Active Material for Non-Aqueous Electrolyte Rechargeable Battery The production method for the cathode active material of the present invention is not particularly limited as long as the composite hydroxide particles described above are used as a precursor and it is possible to form a cathode active material that has a specified structure, average particle size, and particle size distribution. However, when production on an industrial scale is presumed, preferably the cathode active material is formed by a production method that has: a mixing process of mixing the composite hydroxide particles described above with a lithium compound to obtain a lithium mixture; and a calcination process of calcining the obtained lithium mixture in an oxidizing atmosphere at 650° C. to 980° C. When necessary, it is possible to add a heat treatment process or pre-calcination process to the processes above. With this production method, it is particularly possible to obtain a cathode active material that is expressed by the general expression (B).

(2-a) Heat Treatment Process

In the production method for a cathode active material of the present invention, it is possible to arbitrarily provide a heat treatment process before the mixing process, and performing mixing with the lithium compound after the composite hydroxide particles have been heat treated. Here, heat treated particles not only include composite hydroxide particles from which the excess moisture content has been removed in the heat treatment process, but also include transition metal composite oxide particles that have been converted to an oxide (hereafter, referred to as "composite oxide particles"), or include a mixture of these.

The heat treatment process is a process that removes excess moisture that is included in the composite hydroxide particles by performing heat treatment in which the composite hydroxide particles are heated to 105° C. to 750° C. As a result, it is possible to reduce the moisture remaining up until after the calcination process to a fixed amount, and thus it is possible to suppress variation in the composition of the cathode active material that is obtained.

The heating temperature in the heat treatment process is 105° C. to 750° C. When the heating temperature is less than 105° C., it is not possible to remove all of the excess moisture in the composite hydroxide particles, and thus it may not be possible to sufficiently suppress variation in the composition. On the other hand, when the heating temperature is greater than 750° C., further effects cannot be expected, and the production cost increases.

In the heat treatment process, moisture is removed to the extent that no variation occurs in the ratio of the number of atoms of each metal component or number of atoms of Li in the cathode active material, so it is not absolutely necessary to convert all of the composite hydroxide particles to composite oxide particles. However, in order to further reduce variation in the ratio of the number of atoms of each metal component or the number of atoms of Li, preferably heating is performed at 400° C. or higher, and all of the composite hydroxide particles are converted to composite oxide particles. By finding the metal components that are included in the composite hydroxide particles beforehand according to the heat treatment conditions, and setting the mixture ratio with the lithium compound, it is possible to further suppress the variation in composition above.

The atmosphere in which heat treatment is performed is not particularly limited, and as long as the atmosphere is a non-reducing atmosphere, preferably heat treatment is performed in an atmosphere of circulating air that can be performed easily.

Moreover, the amount of time of the heat treatment is not particularly limited, however, from the aspect of adequately removing the moisture in the composite hydroxide particles, preferably heat treatment is performed for at least one hour or more, and more preferably for 5 hours to 15 hours.

(2-b) Mixing Process

The mixing process is a process of obtaining a lithium mixture by mixing a lithium compound with the composite hydroxide particles or heat treated particles described above.

In the mixing process, it is necessary to mix the composite hydroxide particles or heat treated particles with the lithium compound so that the ratio of the number of metal atoms other than lithium in the lithium mixture, and more specifically, the ratio of the sum (Me) of the number of atoms of nickel, cobalt, manganese and additional elements M and the number of lithium atoms (Li) (Li/Me) is preferably 0.95 to 1.5, and more preferably 1.0 to 1.5, and even more preferably 1.0 to 1.35, and still even more preferably 1.0 to 1.2. In other words, Li/Me does not change before or after the calcination process, so it is necessary to mix the composite hydroxide particles or heat treated particles with the lithium compound so that Li/Me in the mixing process becomes the target Li/Me ratio of the cathode active material.

The lithium compound that is used in the mixing process is not particularly limited, however, from the aspect of easy availability, preferably lithium hydroxide, lithium nitrate, lithium carbonate, or a mixture of these is used. Particularly, when taking into consideration the ease of handling and stability of product quality, preferably lithium hydroxide or lithium carbonate is used.

Preferably, the composite hydroxide particles or heat treated particles and the lithium compound are sufficiently mixed to the extent that no powder occurs. When insufficiently mixed, variation in Li/Me between individual particles occurs, and it may not be possible to obtain sufficient battery characteristics. For mixing, it is possible to use a typical mixer. For example, it is possible to use a shaker mixer, a Loedige mixer, a Julia mixer, a V blender and the like.

(2-c) Pre-Calcination Process

When using lithium hydroxide or lithium carbonate as the lithium compound, it is possible after the mixing process and before the calcination process to perform a pre-calcination process on the lithium compound at a temperature that is lower than the calcination temperature that will be described later, and at a temperature of 350° C. to 800° C., and more preferably 450° C. to 780° C. As a result, it is possible to sufficiently disperse lithium into the composite hydroxide particles or heat treated particles, and thus it is possible to obtain more uniform lithium composite oxide particles.

The amount of time during which the lithium compound is maintained at the temperature above is preferably 1 hour to 10 hours and more preferably 3 hours to 6 hours. Moreover, the atmosphere in the pre-calcination process is the same as that of the calcination process that will be described later, and preferably is an oxidizing atmosphere, and more preferably is an atmosphere in which the oxygen concentration is 18% by volume to 100% by volume.

(2-d) Calcination Process

The calcination process is a process for obtaining lithium composite oxide particles by dispersing lithium into the composite hydroxide particles or heat treated particles by calcining the lithium mixture that was obtained in the mixing process.

In this calcination process, the fine primary particles of the low-density section of composite hydroxide particles or heat treated particles begin sintering at a temperature lower than that of plate-shaped primary particles of the center section and high-density section. Moreover, the amount of shrinkage of the low-density section is larger than that of the center section or high-density section that have plate-shaped primary particles. Therefore, the fine primary particles of the low-density section shrink to the center section side or high-density section side where sintering proceeds slowly, and a suitably large hollow section is formed.

On the other hand, as the low-density section shrinks, the center section receives tensile stress in a direction toward the outside in the radial direction of the secondary particle. When this happens, the center section becomes solid or hollow depending on the average ratio of the center section outer diameter and the average ratio of the high-density section radial direction thickness. More specifically, when the average ratio of the center section outer diameter is in the range 20% to 35%, or the average ratio of the high-density section radial direction thickness is in the range 5% to 15%, the center section tends to maintain a solid structure. However, when the average ratio of the center section outer diameter is in the range 35% to 80%, or the average ratio of the high-density radial direction thickness is in the range 15% to 25%, the center section tends to become hollow due to the tensile stress described above. By making the reaction atmosphere at the very beginning of the nucleation process an oxidizing atmosphere and forming a low-density section on the inside of the center section, it is possible to make the center section of the cathode active material hollow. However, in either case, the structure of the center section also changes due to the composition of the composite hydroxide particles or the calcination conditions, so preferably testing is performed beforehand, and the conditions are appropriately controlled so that the center section will have the desired structure.

The furnace that is used in the calcination process is not particularly limited, and any furnace can be used as long as it is possible to heat the lithium mixture in air or in a flow of oxygen. However, from the aspect of uniformly maintaining the atmosphere inside the furnace, preferably an electric furnace that does not produce gas is preferred, and it is possible to suitably use either a batch type or continuous type electric furnace. This is also the same for the furnace used in the heat treatment process and pre-calcination process.

[Calcination Temperature]

It is necessary that the calcination temperature for the lithium mixture be 650° C. to 980° C. When the calcination temperature is less than 650° C., lithium is not sufficiently dispersed into the composite hydroxide particles or heat treated particles, so excess lithium or unreacted composite hydroxide particles or heat treated particles will remain, and crystallization of the lithium composite oxide particles obtained will be insufficient. On the other hand, when the calcination temperature is greater than 980° C., severe sintering will occur among the lithium composite oxide particles, which causes abnormal particle growth to occur, and thus the ratio of irregular shaped coarse particles increases.

In the case of trying to obtain a cathode active material that is expressed by the general expression (B1) described above, the calcination temperature is preferably 650° C. to 900° C. On the other hand, in the case of trying to obtain the cathode active material that is expressed by the general expression (B2) described above, the calcination temperature is preferably 800° C. to 980° C.

Moreover, the rate of the temperature rise in the calcination process is preferably 2° C./minute to 10° C./minute, and more preferably 2° C./minute to 8° C./minute. Furthermore, preferably the temperature during the calcination process is maintained at a temperature near the melting point of the lithium compound for 1 hour to 5 hours, and more preferably, 2 hours to 5 hours. As a result, the composite hydroxide particles or heat treated particles and the lithium compound are able to react more uniformly.

[Calcination Time]

Of the calcination time, the time during which the temperature is maintained at the calcination temperature described above is preferably 2 hours or more, and more preferably 4 hours to 24 hours. When the time during which the temperature is maintained at the calcination temperature is less than 2 hours, lithium is not sufficiently dispersed into the composite hydroxide particles or heat treated particles, so excess lithium or unreacted composite hydroxide particles or heat treated particles remain, and there is a possibility that the crystallization of the lithium composite oxide particles obtained will not be adequate.

After the time for maintaining the calcination temperature is complete, the rate of cooling from the calcination temperature to at least 200° C. is preferably 2° C./minute to 10° C./minute, and more preferably 3° C./minute to 7° C./minute. By controlling the rate of cooling so as to be within this range, it is possible to prevent damage to equipment such as a saggar due to rapid cooling while at the same time maintain productivity.

[Calcination Atmosphere]

The atmosphere during calcination is preferably an oxidizing atmosphere, and preferably is an atmosphere in which the oxygen concentration is 18% by volume to 100% by volume, and a mixed atmosphere of oxygen with the oxygen concentration above, and an inert gas is particularly preferred. In other words, calcination is preferably performed in an air atmosphere or in a flow of oxygen. When the oxygen concentration is less than 18% by volume, there is a possibility that the crystallization of lithium composite particles may not be adequate.

(2-e) Pulverization Process

The lithium composite oxide particles that were obtained from the calcination process may clump together or a light amount of sintering may occur. In such a case, preferably the clumped or sintered lithium oxide particles are pulverized and crushed. By doing so, it is possible to adjust the average particles size and particle size distribution of the obtained cathode active material to be within a suitable range. Pulverization is an operation that loosens up aggregates of plural secondary particles that occurred due to sintering necking among secondary particles during calcination by applying mechanical energy to these aggregated in order to separate the secondary particles without hardly any destruction of the particles themselves.

As the pulverization method, it is possible to use a well-known method; for example, it is possible to use a pin mill or a hammer mill. When performing pulverization, preferably the pulverization force is appropriately adjusted within a range so that the secondary particles are not destroyed.

3. Non-Aqueous Electrolyte Rechargeable Battery

The non-aqueous electrolyte rechargeable battery of the present invention has the same elements as a typical non-aqueous electrolyte rechargeable battery, such as a cathode, anode, separator, non-aqueous electrolyte and the like. The examples that will be explained below are only examples, and the non-aqueous electrolyte rechargeable battery of the present invention can be modified or improved based on the examples disclosed in this specification.

(1) Components (1-a) Cathode

The cathode for a non-aqueous electrolyte rechargeable battery is made as described below, for example, using the cathode active material for a non-aqueous electrolyte rechargeable battery that is obtained according to the present invention.

First, an electrically conductive material and binding agent are mixed with the powdered cathode active material that was obtained according to the present invention, and as necessary, activated carbon or a solvent such as viscosity modifier and the like are added, and then these are kneaded to make a cathode paste. When doing this, the mixture ratios in the cathode paste are also important for setting the performance of the non-aqueous electrolyte rechargeable battery. For example, when the solid content of the cathode paste without the solvent is taken to be 100 parts by mass, then, as in the cathode of a typical non-aqueous electrolyte rechargeable battery, the amount of cathode active material that is included can be taken to be 60 parts by mass to 95 parts by mass, the amount of conductive material that is included can be taken to be 1 part by mass to 20 parts by mass, and the amount of binding agent included can be taken to be 1 part by mass to 20 parts by mass.

The cathode paste that is obtained is applied to the surface of an aluminum foil current collector, and dried to let the solvent disperse. When necessary, in order to increase the electrode density, pressure may be applied using a roll press. In this way, a sheet type cathode can be manufactured. The sheet-type cathode is then cut to an appropriate size for the target battery, and provided for making the battery. However, the production method for a cathode is not limited to this example, and it is also possible to use other methods.

As the conductive material, it is possible to use graphite (natural graphite, artificial graphite, expanded graphite and the like), or a carbon black material such as acetylene black, kitchen black and the like.

The binding agent performs the role of binding together the active material particles; for example, it is possible to use polyvinylidene fluoride (PVDF), polytetrafluoroethylene (PTFE), fluororubber, ethylene propylene diene rubber, styrene butadiene rubber, cellulose resin and polyacrylic acid.

Moreover, as needed, it is also possible to add a solvent for dispersing the cathode active material, conductive material and activated carbon and dissolving the binding agent. As the solvent, it is basically possible to use an organic solvent such as N-methyl-2-pyrrolidone and the like. Moreover, in order to increase the electric double layer capacity, it is also possible to add activated carbon to the cathode material.

(1-b) Anode

For the anode, it is possible to use an anode that is formed by mixing a binding agent with metal lithium, lithium alloy or the like, or with an anode active material for which adsorption or desorption of lithium ions is possible, adding a suitable solvent to form a paste-like anode material, applying that anode material onto the surface of a metal foil, for example copper foil current collector, drying and when necessary, applying pressure to increase the electrode density.

As the anode active material, it is possible to use a material that includes lithium such as metal lithium, lithium alloy and the like, or a carbon material such as an organic compound calcined body such as natural carbon, artificial carbon, phenol resin and the like, or powder carbon material such as coke that is capable of adsorption or desorption of lithium ions. In this case, as the anode binding agent, as in the case of the cathode, it is possible to use a fluororesin such as PVDF and the like, and as the solvent for dispersing the active material and the binding agent, it is possible to use an organic solvent such as N-methyl-2-pyrrolidone and the like.

(1-c) Separator

The separator is arranged so as to be between the cathode and the anode, and has the function of separating the cathode and the anode and maintaining the electrolytic characteristic. As such a separator, it is possible to use, for example, a thin film of polyethylene, polypropylene and the like, having many fine holes, however, the separator is not particularly limited as long as it has the functions described above.

(1-d) Non-Aqueous Electrolyte

The non-aqueous electrolyte that is formed by dissolving lithium salt as a supporting electrolyte into an organic solvent.

As the organic solvent, it is possible to use a single kind or a mixture of two or more kinds selected from: a cyclic carbonate such as ethylene carbonate, propylene carbonate, butylene carbonate, trifluoro propylene carbonate and the like; a chain carbonate such as diethyl carbonate, dimethyl carbonate, ethyl methyl carbonate, dipropyl carbonate and the like; an ether compound such as tetrahydrofuran, 2-methyltetrahydrofuran, dimethoxyethane and the like; a sulfur compound such as ethyl methyl sulfone, butane sultone and the like; and a phosphorus compound such as triethyl phosphate, trioctyl phosphate and the like.

As the supporting electrolyte, it is possible to use $LiPF_6$, $LiBF_4$, $LiClO_4$, $LiAsF_6$, $LiN(CF_3SO_2)_2$ and the like, or a mixed salt of these.

Furthermore, the non-aqueous electrolyte can also include a radical scavenger, a surfactant, a flame retardant and the like.

(2) Non-Aqueous Electrolyte Rechargeable Battery

Various shapes such as a cylindrical shape or layered shape can be used as the shape of the non-aqueous electrolyte secondary battery of the present invention that is formed using the cathode, anode, separator and non-aqueous electrolyte explained above.

No matter what shape is used, electrodes are formed by layering the cathode and anode by way of the separator, and the electrodes are then impregnated with the non-aqueous electrolyte, then collector leads or the like are used to connect between the cathode collector and a cathode terminal that goes to the outside, and between the anode collector and an anode terminal that goes to the outside; this is then sealed in a battery case to complete the non-aqueous electrolyte secondary battery.

(3) Characteristics of Non-Aqueous Electrolyte Rechargeable Battery

The non-aqueous electrolyte secondary battery of the present invention is constructed as described above and has a cathode that uses the cathode active material of the present invention as the cathode material, and has excellent capacity characteristics, output characteristics, and cycling characteristics. Moreover, when compared with a rechargeable battery that uses cathode active material that uses conventional lithium nickel oxide particles, the rechargeable battery has excellent thermal stability and safety.

Figure 4:
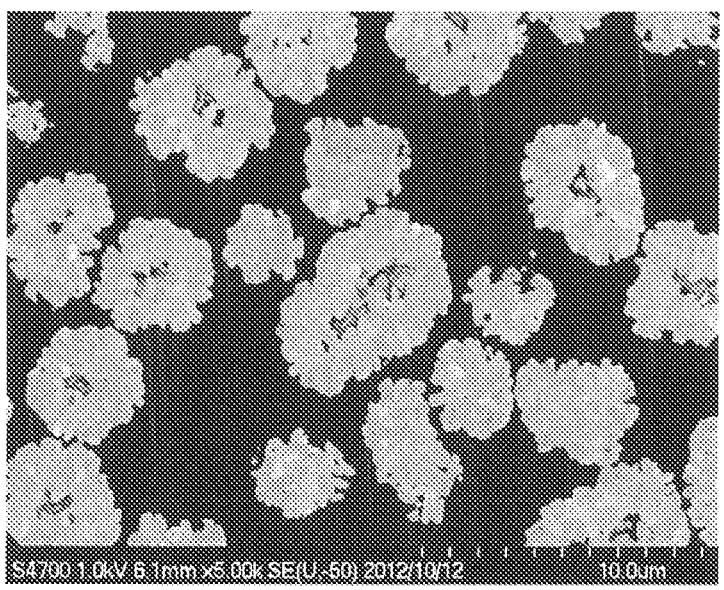
FIG. 4 is an FE-SEM photograph (observation magnification rate: 5,000×) of the cross section of a cathode active material obtained in a first comparative example.

For example, in the case of constructing a 2032 type coin battery such as illustrated in FIG. 4 using the cathode active material of the present invention, it is possible to simultaneously achieve an initial discharge capacity of 150 mAh/g or more, and preferably 158 mAh/g or more, a cathode resistance of 1.2Ω or less, and preferably 1.15Ω or less, and a 500 cycle capacity retention rate of 75% or more, and preferably 80% or more.

(A) Application

The non-aqueous electrolyte rechargeable battery of the present invention, as described above, has excellent capacity characteristics, output characteristics and cycling characteristics, and can be suitably used for the power source of compact portable electronic devices (notebook personal computers, mobile telephones, and the like) that require these characteristics at a high level. Moreover, the non-aqueous electrolyte rechargeable battery of the present invention also is very safe, and not only is the battery compact and capable of high output, but expensive protective circuitry can be omitted, so can also be suitably used as the power source for transport equipment having restricted installation space.

EXAMPLES

In the following, the present invention will be explained in detail using examples and comparative examples. In the example and comparative examples below, unless stated otherwise, samples using special grade chemicals manufactured by Wako Pure Chemical Industries Co., Ltd. were used for producing the composite hydroxide particles and the cathode active material. Moreover, through the nucleation process and particle growth process, the pH value of the reaction aqueous solution was measured using a pH controller (NPH-690D, manufactured by Nissin Rika Co., Ltd.), and by adjusting the amount of sodium hydroxide aqueous solution to supply based on the measurement value, the amount of variation in the pH value of the reaction aqueous solution in each process was controlled to be within the range ±0.2.

Example 1

(a) Producing Composite Hydroxide Particles
[Nucleation Process]

First, 900 ml of water was put into a reaction vessel, then while stirring the temperature of the vessel was set to 40° C. When doing this, nitrogen gas was allowed to flow through the inside of the reaction vessel for 30 minutes, and the reaction atmosphere was made to be a non-oxidizing atmosphere in which the oxygen concentration was 2% by volume or less. Next, 25% by mass of sodium hydroxide aqueous solution and 25% by mass of ammonia water were supplied, and by adjusting the pH value at a standard liquid temperature of 25° C. to be 12.8, and the ammonium concentration to be 10 g/L, a pre-reaction aqueous solution was formed.

At the same time, nickel sulfate, cobalt sulfate, manganese sulfate and zirconium sulfate were dissolved in water so that the mole ratios of each of the metal elements were Ni:Mn:Co:Zr=33.1:33.1:33.1:0.2, and 2 mol/L of raw material aqueous solution was prepared.

Next, by supplying this raw material aqueous solution to the pre-reaction aqueous solution at 10 ml/min, aqueous solution for the nucleation process was formed, and nucleation was performed for 1 minute. When doing this, the pH value and ammonium ion concentration of the aqueous solution for nucleation were maintained within the ranges described above.

[Particle Growth Process]

After nucleation was finished, the supply of all aqueous solutions was temporarily stopped, and by adding sulfuric acid to adjust the pH value at a standard liquid temperature of 25° C. to be 11.6, an aqueous solution for particle growth was formed. After the pH value reached the specified value, the raw material aqueous solution described above and sodium tungstate aqueous solution were supplied so that the mole ratios of the metal elements included in these aqueous solutions became Ni:Mn:Co:Zr:W=33.1:33.1:33.1:0.2:0.5, and the nuclei (particles) that were generated in the nucleation process were caused to grow.

After 60 minutes has elapsed from the start of the particle growth process (25% of the total particle growth processing time), the supply of all of the aqueous solutions was temporarily stopped, and air was allowed to flow through the reaction vessel to make the reaction atmosphere an oxidizing atmosphere in which the oxygen concentration was 21% by volume (switching operation 1). In this state, supply of the raw material aqueous solution was restarted, and the particles were caused to grow.

After the supply of the raw material aqueous solution was restarted, the crystallization reaction was continued for 20 minutes (8.3% of the total particle growth processing time), the supply of all of the aqueous solutions was temporarily stopped again, and nitrogen was allowed to flow through the reaction vessel to make the reaction atmosphere a non-oxidizing atmosphere in which the oxygen concentration was 2% by volume or less (switching operation 2). In this state, the supply of the raw material aqueous solution was restarted, and the particles were caused to grow.

After the supply of raw material aqueous solution was restarted, the crystallization reaction was continued for 160 minutes (66.7% of the total particle growth processing time), after which the supply of all of the aqueous solutions was stopped and the particle growth process was ended. When doing this, the concentration of the product in the particle growth aqueous solution was 86 g/L. After that, the obtained product was washed, filtered and dried, to obtain powdered composite hydroxide particles.

In the particle growth process, 25% by mass of sodium hydroxide aqueous solution, and 25% by mass of ammonia water were supplied to keep the pH value and ammonium ion concentration of the aqueous solution for particle growth within the ranged described above throughout this process.

(b) Evaluation of Composite Hydroxide Particles

By performing analysis using an ICP atomic emission spectrometer (ICPE-9000, manufactured by Shimadzu Corporation), the composite hydroxide particles were confirmed to be expressed by the general expression: $Ni_{0.331}Mn_{0.331}Co_{0.331}Zr_{0.002}W_{0.005}(OH)_2$. Moreover, a laser diffraction scattering type particle size analyzer (Microtrac HRA, manufactured by Nikkiso Co., Ltd.) was used to measure the average particle size of the composite hydroxide particles, and to measure d10 and d90, and the index [(d90−d10)/average particle size] that indicates the extend of the particle size distribution was calculated. Furthermore, by observing the composite hydroxide particles and the cross section thereof using an SEM (JSM-6360LA, manufactured by JEOL Ltd.), the shape and average particle size of the primary particles of the composite hydroxide particles, the structure of the secondary particles, the average ratio of the center section outer diameter, and the average ratio of the high-density section radial direction thickness were found. These results are given in Table 2 and FIG. 1.

(c) Production of Cathode Active Material

The composite hydroxide particles that were obtained as described above were heat treated for 12 hours at 120° C. in a flow of air (oxygen concentration: 21% by volume), after which the heat treated particles were sufficiently mixed with lithium carbonate using a shaker mixer (TURBULA Type T2C, manufactured by Willy A. Bachofen (WAB)) to obtain a lithium mixture.

This lithium mixture was calcined by being heated to 950° C. at a temperature increase rate of 2.5° C./min in a flow of air (oxygen concentration: 21% by volume), and kept at this temperature for 4 hours, then was cooled to room temperature at a cooling rate of approximately 4° C./min. The cathode active material that was obtained in this way had clumps or light sintering. Therefore, this cathode active material was pulverized to adjust the average particle size and particle size distribution.

(d) Evaluation of Cathode Active Material

Figure 2:
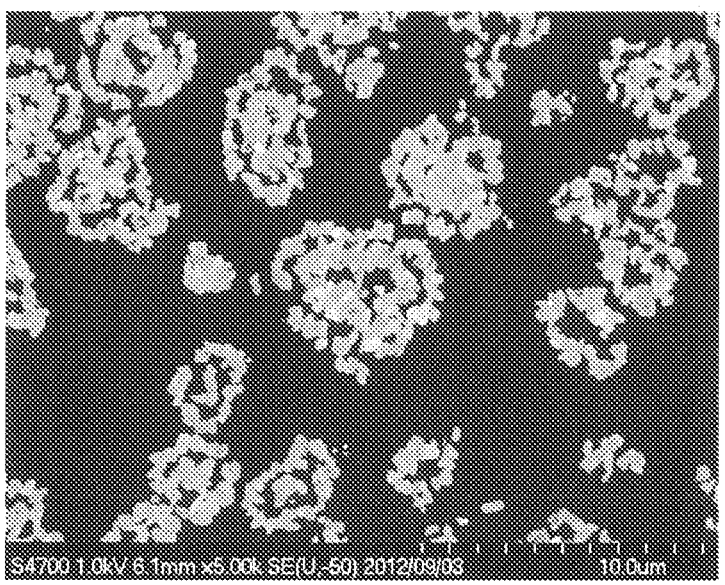
FIG. 2 is an FE-SEM photograph (observation magnification rate: 5,000×) of the cross section of a cathode active material obtained in the first example.

By performing analysis using an ICP atomic emission spectrometer, this cathode active material was confirmed to be expressed by the general expression: $Li_{1.14}Ni_{0.331}Mn_{0.331}Co_{0.331}Zr_{0.002}W_{0.005}O_2$. Moreover, a laser diffraction scattering type particle size analyzer was used to measure the average particle size of the composite oxide particles, and to measure d10 and d90, and the index [(d90−d10)/average particle size] that indicates the extent of the particle size distribution was calculated. Furthermore, by observing the cathode active material and the cross section thereof using an SEM, the structure of this cathode active material, the average ratio of the center section outer diameter, and the average ratio of the high-density section radial direction thickness were found. In addition, a flow method gas adsorption type specific surface area measurement device (Multisorb, manufactured by Yuasa-ionics) was used to find the specific surface area, and a tapping machine (KRS-406, manufactured by Kuramochi Scientific Instruments Co., Ltd) was used to find the tap density. These results are given in Table 3 and FIG. 2.

(e) Production of Rechargeable Battery 52.5 mg of the cathode active material that was obtained as described above, 15 mg of acetylene black, and 7.5 mg of PTEE were mixed, and press formed under a pressure of 100 MPa to a diameter of 11 mm and thickness of 100 μm, and then dried for 12 hours at 120° C. in a vacuum drier to make a cathode (1).

Next, this cathode (1) was used to make a 2032 type coin battery (B) inside a glove box having an Ar atmosphere that was controlled to have a dew point of −80° C. Lithium metal having a diameter of 17 mm and thickness of 1 mm was used for the anode (2) of this 2032 type coin battery, and 1 M of a mixed solution having equal parts of ethylene carbonate (EC) and diethyl carbonate (DEC) and $LiClO_4$ as the supporting electrolyte (manufactured by Tomiyama Pure Chemical Industries, Ltd.) was used as the electrolyte. Moreover, a porous polyethylene thin film having a thickness of 25 μm was used as the separator (3). The 2032 type coin battery (B) was formed by assembling a cathode can (5) and anode can (6) having a gasket (4) into a coin shaped battery.

(1) Battery Evaluation

[Initial Electric Discharge Capacity]

After making the 2032 type coin battery, the battery was left for 24 hours, and after the open circuit voltage (OCV) became stable, the initial electric discharge capacity was found by performing a charge/discharge test in which the battery was charged to a cut-off voltage of 4.3 V with the current density with respect to the cathode being 0.1 mA/cm², and after stopping for one hours, the battery was discharged to a cut-off voltage of 3.0 V and the discharge capacity was measured. When doing this, a multi-channel voltage/current generator (R6741A, manufactured by Advantest Corporation) was used.

[Cathode Resistance]

Figure 5:
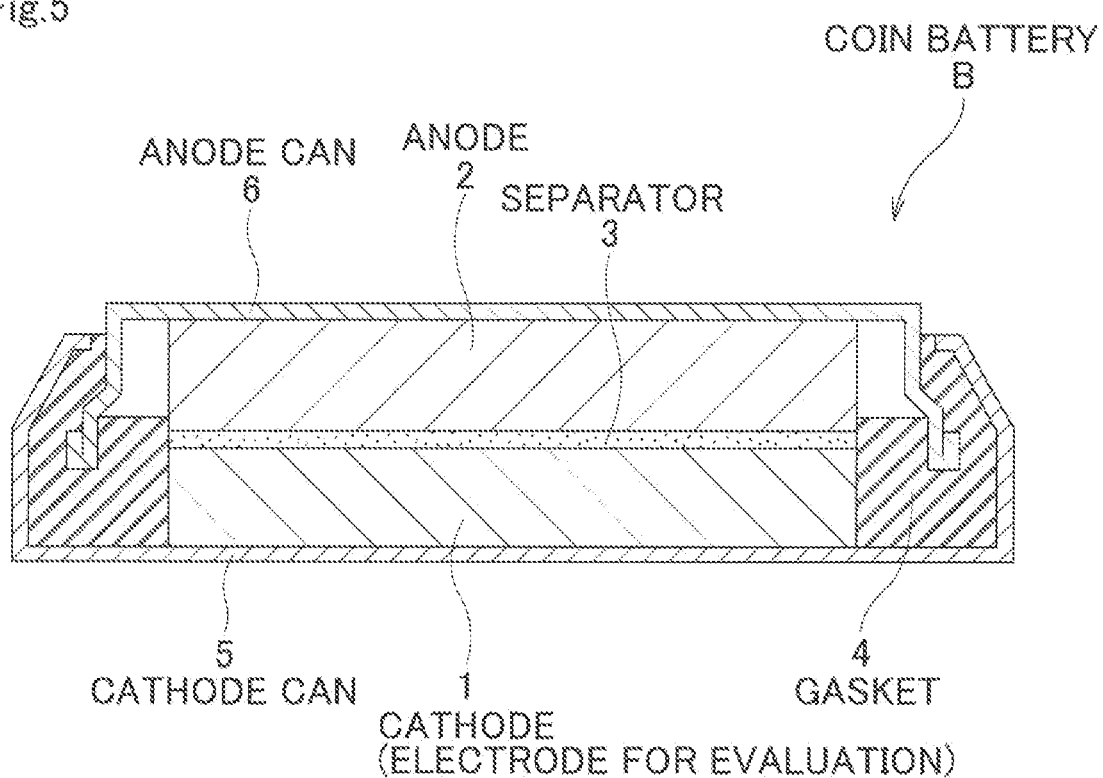
FIG. 5 is a cross-sectional view of a 2032-type coin battery that was used for evaluation.
Figure 6:
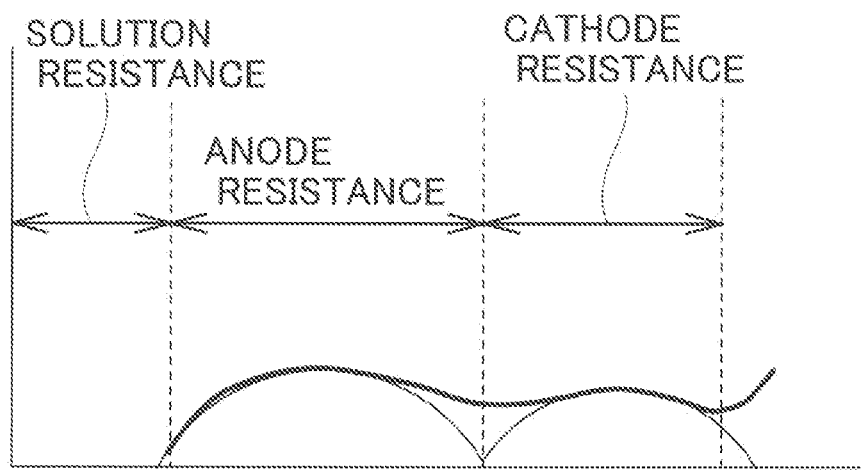
FIG. 6 is a drawing for explaining an equivalent circuit that was used for measurement and analysis in impedance evaluation.
Figure 6:
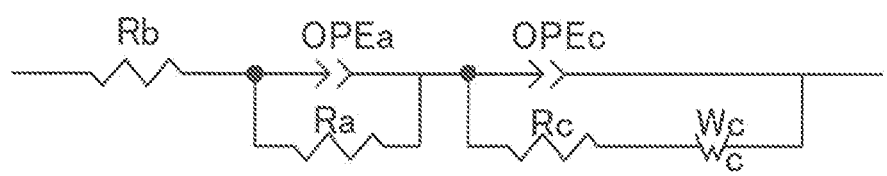

Using the 2032 type coin battery that was charged to a charge potential of 4.1 V, the resistance value was measured by an alternating current impedance method. A frequency response analyzer and a potentio-galvanostat (manufactured by Solatron) were used in the measurement, and the Nyquist plot illustrated in FIG. 5 was obtained. The plot is expressed as a sum of characteristic curves that indicate the solution resistance, anode resistance and capacity, and cathode resistance and capacity, so the value of the cathode resistance was calculated by fitting calculation using an equivalent circuit.

[Cycling Characteristic]

The capacity retention rate for 500 cycles was calculated by repeating the charge/discharge test described above and measuring the discharge capacity on the 500th time with respect to the initial discharge capacity. The results are given in Table 3.

Example 2

In the particle growth process, except for performing switch operation 1 after 60 minutes had elapsed from the start of the particle growth process (25% of the overall time of the particle growth process), continuing the crystallization reaction for 10 minutes after restarting the supply of raw material aqueous solution (4.2% of the overall time of the particle growth process), then performing switch operation 2, and continuing the crystallization reaction for 170 minutes (70.8% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 3

Figure 3:
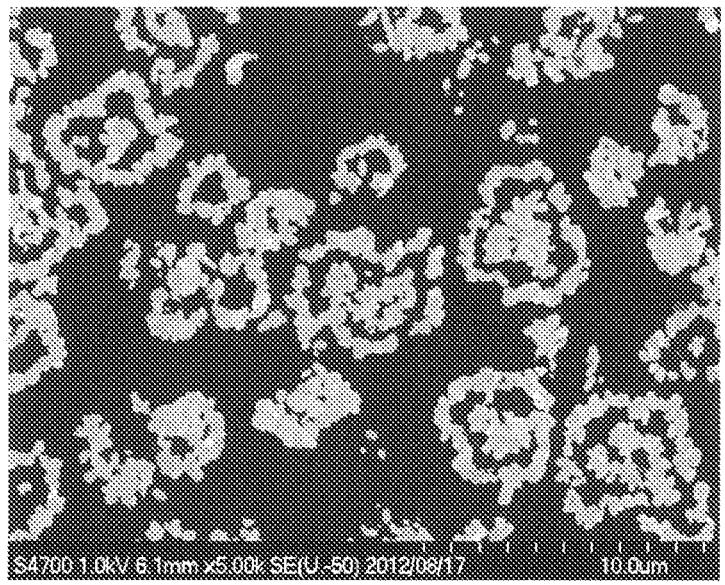
FIG. 3 is an FE-SEM photograph (observation magnification rate: 5,000×) of the cross section of a cathode active material obtained in a third example.

In the particle growth process, except for performing switch operation 1 after 25 minutes had elapsed from the start of the particle growth process (10.4% of the overall time of the particle growth process), continuing the crystallization reaction for 20 minutes after restarting the supply of raw material aqueous solution (8.3% of the overall time of the particle growth process), then performing switch operation 2, and continuing the crystallization reaction for 195 minutes (81.3% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3 and FIG. 3.

In Example 3, the rechargeable battery has a somewhat higher cathode resistance than that in Example 1. This is probably because there is a decrease in the points of contact between the center section and outer-shell section of the cathode active material, which hinders electron transfer inside the particles.

Example 4

In the particle growth process, except for performing switch operation 1 after 70 minutes had elapsed from the start of the particle growth process (29.2% of the overall time of the particle growth process), continuing the crystallization reaction for 20 minutes after restarting the supply of raw material aqueous solution (8.3% of the overall time of the particle growth process), then performing switch operation 2, and continuing the crystallization reaction for 150 minutes (62.5% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 5

In the particle growth process, except for performing switch operation 1 after 15 minutes had elapsed from the start of the particle growth process (6.3% of the overall time of the particle growth process), continuing the crystallization reaction for 20 minutes after restarting the supply of raw material aqueous solution (8.3% of the overall time of the particle growth process), then performing switch operation 2, and continuing the crystallization reaction for 205 minutes (85.4% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 6

In the particle growth process, except for performing switch operation 1 after 80 minutes had elapsed from the start of the particle growth process (33.3% of the overall time of the particle growth process), continuing the crystallization reaction for 20 minutes after restarting the supply of raw material aqueous solution (8.3% of the overall time of the particle growth process), then performing switch operation 2, and continuing the crystallization reaction for 140 minutes (58.3% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 7

In the particle growth process, except for performing switch operation 1 after 60 minutes had elapsed from the start of the particle growth process (25% of the overall time of the particle growth process), continuing the crystallization reaction for 35 minutes after restarting the supply of raw material aqueous solution (14.6% of the overall time of the particle growth process), then performing switch operation 2, and continuing the crystallization reaction for 145 minutes (60.4% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 8

In the particle growth process, except for performing switch operation 1 after 60 minutes had elapsed from the start of the particle growth process (25% of the overall time of the particle growth process), continuing the crystallization reaction for 45 minutes after restarting the supply of raw material aqueous solution (18.8% of the overall time of the particle growth process), then performing switch operation 2, and continuing the crystallization reaction for 135 minutes (56.3% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 9

In the particle growth process, except for making the oxygen concentration in the reaction atmosphere 10% by volume by performing switching operation 1, composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 10

In the particle growth process, except for making the oxygen concentration in the reaction atmosphere 5.5% by volume by performing switching operation 1, composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 11

Except for making the oxygen concentration in the reaction atmosphere during the nucleation process and the beginning of the particle growth process 4% by volume, and then in the particle growth process, making the oxygen concentration in the reaction atmosphere 4% by volume by performing switching operation 2, composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Example 12

In the particle growth process, except for performing the switching operations 1 and 2 two times each at specified timing, composite hydroxide particles were obtained in the same was as in Example 1. More specifically, switching operation 1 was performed after 30 minutes had elapsed from the start of the particle growth process (12.5% of the overall time of the particle growth process), then the supply of raw material aqueous solution was restarted, and the crystallization process was continued for 15 minutes (6.3% of the overall time of the particle growth process), switching operation 2 was then performed, and the crystallization process was continued for 90 minutes (37.5% of the overall time of the particle growth process). Next, switching operation 1 is performed, and after the supply of raw material aqueous solution is restarted, the crystallization reaction was continued for 15 minutes, after which switching operation 2 was performed, and the crystallization reaction was continued for 90 minutes. The composite hydroxide particles that were obtained in this way were evaluated in the same way as in Example 1. Moreover, except for using these composite hydroxide particles as the precursor, the cathode active material and rechargeable battery were obtained in the same way as in Example 1, and evaluation performed. The results are given in Table 3. The cathode active material that was obtained in Example 12 was such that the thickness in the radial direction of the inner-shell section, and the thickness in the radial direction of the outer-shell section were nearly the same.

Comparative Example 1

In the particle growth process, except for not performing switching operations 1 and 2, and maintaining a non-oxidizing atmosphere in which the oxygen concentration was 2% by volume or less, composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3 and FIG. 4. In Comparative Example 1, composite hydroxide particles (secondary particles) comprising only plate shaped primary particles were obtained, however, due to the particles size being large, in part of the cathode active material having these composite hydroxide particles as a precursor, a hollow section was formed in the center section by shrinkage during calcination.

Comparative Example 2

In the particle growth process, except for performing switch operation 1 after 10 minutes had elapsed from the start of the particle growth process (4.2% of the overall time of the particle growth process), continuing the crystallization reaction for 35 minutes after restarting the supply of raw material aqueous solution (14.6% of the overall time of the particle growth process), then performing switch operation 2, and continuing the crystallization reaction for 195 minutes (81.3% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Comparative Example 3

In the particle growth process, except for performing switch operation 1 after 90 minutes had elapsed from the start of the particle growth process (37.5% of the overall time of the particle growth process), continuing the crystallization reaction for 20 minutes after restarting the supply of raw material aqueous solution (8.3% of the overall time of the particle growth process), then performing switch operation 2, and continuing the crystallization reaction for 130 minutes (54.2% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

Comparative Example 4

In the particle growth process, except for performing switch operation 1 after 60 minutes had elapsed from the start of the particle growth process (25% of the overall time of the particle growth process), continuing the crystallization reaction for 55 minutes after restarting the supply of raw material aqueous solution (22.9% of the overall time of the particle growth process), then performing switch operation 2, and continuing the crystallization reaction for 125 minutes (52.1% of the overall time of the particle growth process), composite hydroxide particles were obtained in the same way as in Example 1, and evaluation was performed. The results are given in Table 2. Moreover, except for using these composite hydroxide particles as the precursor, the cathode active material and rechargeable battery were obtained in the same way as in Example 1, and evaluation performed. The results are given in Table 3.

TABLE 1

| | Start to Switching Operation 1 | | Switching Operation 1 to 2 | | Switching Operation 2 to 1 | | Switching Operation 1 to 2 | | Switching Operation 2 to End | |
|---|---|---|---|---|---|---|---|---|---|---|
| | Oxygen Concentration (% by volume) | Switching time (%) | Oxygen Concentration (% by volume) | Reaction time (%) | Oxygen Concentration (% by volume) | Reaction time (%) | Oxygen Concentration (% by volume) | Reaction time (%) | Oxygen Concentration (% by volume) | Reaction time (%) |
| Ex-1 | 2 or less | 25 | 21 | 8.3 | — | — | — | — | 2 or less | 66.7 |
| Ex-2 | 2 or less | 25 | 21 | 4.2 | — | — | — | — | 2 or less | 70.8 |
| Ex-3 | 2 or less | 10.4 | 21 | 8.3 | — | — | — | — | 2 or less | 81.3 |
| Ex-4 | 2 or less | 29.2 | 21 | 8.3 | — | — | — | — | 2 or less | 62.5 |
| Ex-5 | 2 or less | 6.3 | 21 | 8.3 | — | — | — | — | 2 or less | 85.4 |
| Ex-6 | 2 or less | 33.3 | 21 | 8.3 | — | — | — | — | 2 or less | 58.3 |
| Ex-7 | 2 or less | 25 | 21 | 14.6 | — | — | — | — | 2 or less | 60.4 |
| Ex-8 | 2 or less | 25 | 21 | 18.8 | — | — | — | — | 2 or less | 56.3 |
| Ex-9 | 2 or less | 25 | 10 | 8.3 | — | — | — | — | 2 or less | 66.7 |
| Ex-10 | 2 or less | 25 | 5.5 | 8.3 | — | — | — | — | 2 or less | 66.7 |
| Ex-11 | 4 | 25 | 21 | 8.3 | — | — | — | — | 4 | 66.7 |
| Ex-12 | 2 or less | 12.5 | 21 | 6.3 | 2 or less | 12.5 | 21 | 6.3 | 2 or less | 37.5 |
| CE-1 | 2 or less | — | 2 or less | — | — | — | — | — | 2 or less | — |
| CE-2 | 2 or less | 4.2 | 21 | 14.6 | — | — | — | — | 2 or less | 81.3 |
| CE-3 | 2 or less | 37.5 | 21 | 8.3 | — | — | — | — | 2 or less | 54.2 |
| CE-4 | 2 or less | 25 | 21 | 22.9 | — | — | — | — | 2 or less | 52.1 |

TABLE 2

| | | Primary Particles | | | | Secondary Particles | | | |
|---|---|---|---|---|---|---|---|---|---|
| | | Center Section/ High-density Section | | Low-density Section | | Average Ratio of Center Section Outer Diameter (%) | Average Ratio of High-density Section Radial Direction Thickness (%) | Average Particle Size (μm) | (d90-d10)/ Average Particle Size |
| | Composition | shape | Average Particle Size (μm) | shape | Average Particle Size (μm) | | | | |
| Ex-1 | $Ni_{0.331}Mn_{0.331}Co_{0.331}Zr_{0.002}W_{0.005}(OH)_2$ | Plate shaped | 0.6 | Plate shaped/ Needle shaped | 0.2 | 69 | 13 | 5.5 | 0.41 |
| Ex-2 | $Ni_{0.331}Mn_{0.331}Co_{0.331}Zr_{0.002}W_{0.005}(OH)_2$ | Plate shaped | 0.6 | Plate shaped/ Needle shaped | 0.2 | 70 | 14 | 4.8 | 0.39 |
| Ex-3 | $Ni_{0.331}Mn_{0.331}Co_{0.331}Zr_{0.002}W_{0.005}(OH)_2$ | Plate shaped | 0.6 | Plate shaped/ Needle shaped | 0.2 | 56 | 15 | 5.5 | 0.40 |
| Ex-4 | $Ni_{0.331}Mn_{0.331}Co_{0.331}Zr_{0.002}W_{0.005}(OH)_2$ | Plate shaped | 0.6 | Plate shaped/ Needle shaped | 0.2 | 71 | 12 | 4.7 | 0.41 |
| Ex-5 | $Ni_{0.331}Mn_{0.331}Co_{0.331}Zr_{0.002}W_{0.005}(OH)_2$ | Plate shaped | 0.6 | Plate shaped/ Needle shaped | 0.2 | 44 | 18 | 4.1 | 0.48 |
| Ex-6 | $Ni_{0.331}Mn_{0.331}Co_{0.331}Zr_{0.002}W_{0.005}(OH)_2$ | Plate shaped | 0.7 | Plate shaped/ Needle shaped | 0.2 | 76 | 8 | 5.8 | 0.45 |
| Ex-7 | $Ni_{0.331}Mn_{0.331}Co_{0.331}Zr_{0.002}W_{0.005}(OH)_2$ | Plate shaped | 0.6 | Plate shaped/ Needle shaped | 0.2 | 71 | 9 | 5.1 | 0.46 |
| Ex-8 | $Ni_{0.331}Mn_{0.331}Co_{0.331}Zr_{0.002}W_{0.005}(OH)_2$ | Plate shaped | 0.6 | Plate shaped/ Needle shaped | 0.2 | 69 | 7 | 5.1 | 0.44 |

TABLE 2-continued

| | | Primary Particles | | | | Secondary Particles | | | |
|---|---|---|---|---|---|---|---|---|---|
| | | Center Section/High-density Section | | Low-density Section | | | | | |
| | Composition | shape | Average Particle Size (μm) | shape | Average Particle Size (μm) | Average Ratio of Center Section Outer Diameter (%) | Average Ratio of High-density Section Radial Direction Thickness (%) | Average Particle Size (μm) | (d90-d10)/ Average Particle Size |
| Ex-9 | $Ni_{0.331}Mn_{0.331}Co_{0.331}Zr_{0.002}W_{0.005}(OH)_2$ | Plate shaped | 0.6 | Plate shaped/Needle shaped | 0.3 | 68 | 12 | 5.4 | 0.40 |
| Ex-10 | $Ni_{0.331}Mn_{0.331}Co_{0.331}Zr_{0.002}W_{0.005}(OH)_2$ | Plate shaped | 0.6 | Plate shaped/Needle shaped | 0.3 | 68 | 13 | 5.3 | 0.41 |
| Ex-11 | $Ni_{0.331}Mn_{0.331}Co_{0.331}Zr_{0.002}W_{0.005}(OH)_2$ | Plate shaped | 0.4 | Plate shaped/Needle shaped | 0.2 | 67 | 12 | 6.2 | 0.45 |
| Ex-12 | $Ni_{0.331}Mn_{0.331}Co_{0.331}Zr_{0.002}W_{0.005}(OH)_2$ | Plate shaped | 0.6 | Plate shaped/Needle shaped | 0.2 | 61 | 6 | 5.8 | 0.47 |
| CE-1 | $Ni_{0.331}Mn_{0.331}Co_{0.331}Zr_{0.002}W_{0.005}(OH)_2$ | Plate shaped | 0.7 | — | — | — | — | 5.5 | 0.38 |
| CE-2 | $Ni_{0.331}Mn_{0.331}Co_{0.331}Zr_{0.002}W_{0.005}(OH)_2$ | Plate shaped | 0.6 | Plate shaped/Needle shaped | 0.2 | 28 | 19 | 6.8 | 0.60 |
| CE-3 | $Ni_{0.331}Mn_{0.331}Co_{0.331}Zr_{0.002}W_{0.005}(OH)_2$ | Plate shaped | 0.6 | Plate shaped/Needle shaped | 0.2 | 82 | 4 | 5.5 | 0.43 |
| CE-4 | $Ni_{0.331}Mn_{0.331}Co_{0.331}Zr_{0.002}W_{0.005}(OH)_2$ | Plate shaped | 0.6 | Plate shaped/Needle shaped | 0.2 | 69 | 4 | 5.2 | 0.48 |

TABLE 3

| | Cathode Active Material | | | |
|---|---|---|---|---|
| | Composition | Structure | Average Ratio of Center Section Outer Diameter (%) | Average Ratio of Outer-shell Section Radical Direction Thickness (%) |
| Ex-1 | $Li_{1.14}Ni_{0.331}Mn_{0.331}Co_{0.331}Zr_{0.002}W_{0.005}O_2$ | Multi Layered | 68 | 12 |
| Ex-2 | $Li_{1.14}Ni_{0.331}Mn_{0.331}Co_{0.331}Zr_{0.002}W_{0.005}O_2$ | Multi Layered | 69 | 14 |
| Ex-3 | $Li_{1.14}Ni_{0.331}Mn_{0.331}Co_{0.331}Zr_{0.002}W_{0.005}O_2$ | Multi Layered | 55 | 14 |
| Ex-4 | $Li_{1.14}Ni_{0.331}Mn_{0.331}Co_{0.331}Zr_{0.002}W_{0.005}O_2$ | Multi Layered | 70 | 11 |
| Ex-5 | $Li_{1.14}Ni_{0.331}Mn_{0.331}Co_{0.331}Zr_{0.002}W_{0.005}O_2$ | Multi Layered | 44 | 16 |
| Ex-6 | $Li_{1.14}Ni_{0.331}Mn_{0.331}Co_{0.331}Zr_{0.002}W_{0.005}O_2$ | Multi Layered | 75 | 6 |
| Ex-7 | $Li_{1.14}Ni_{0.331}Mn_{0.331}Co_{0.331}Zr_{0.002}W_{0.005}O_2$ | Multi Layered | 71 | 8 |
| Ex-8 | $Li_{1.14}Ni_{0.331}Mn_{0.331}Co_{0.331}Zr_{0.002}W_{0.005}O_2$ | Multi Layered | 69 | 6 |
| Ex-9 | $Li_{1.14}Ni_{0.331}Mn_{0.331}Co_{0.331}Zr_{0.002}W_{0.005}O_2$ | Multi Layered | 68 | 13 |
| Ex-10 | $Li_{1.14}Ni_{0.331}Mn_{0.331}Co_{0.331}Zr_{0.002}W_{0.005}O_2$ | Multi Layered | 69 | 13 |
| Ex-11 | $Li_{1.14}Ni_{0.331}Mn_{0.331}Co_{0.331}Zr_{0.002}W_{0.005}O_2$ | Multi Layered | 70 | 11 |
| Ex-12 | $Li_{1.14}Ni_{0.331}Mn_{0.331}Co_{0.331}Zr_{0.002}W_{0.005}O_2$ | Multi Layered | 60 | 6 |
| CE-1 | $Li_{1.14}Ni_{0.331}Mn_{0.331}Co_{0.331}Zr_{0.002}W_{0.005}O_2$ | Solid/Hollow | — | 49 |
| CE-2 | $Li_{1.14}Ni_{0.331}Mn_{0.331}Co_{0.331}Zr_{0.002}W_{0.005}O_2$ | Multi Layered/Hollow | 25 | 20 |
| CE-3 | $Li_{1.14}Ni_{0.331}Mn_{0.331}Co_{0.331}Zr_{0.002}W_{0.005}O_2$ | Hollow | — | 45 |
| CE-4 | $Li_{1.14}Ni_{0.331}Mn_{0.331}Co_{0.331}Zr_{0.002}W_{0.005}O_2$ | Multi Layered/Hollow | 82 | 2 |

| | Cathode Active Material | | | | Rechargeable Battery | | |
|---|---|---|---|---|---|---|---|
| | Average Particle Size (μm) | (d90-d10)/ Average Particle Size | Specific Surface Area (m²/g) | Tap Density (g/cm³) | Initial Discharge Capacity (mAh/g) | Cathode Resistance (Ω) | Capacity Retention Rate (%) |
| Ex-1 | 5.3 | 0.40 | 1.61 | 1.79 | 159.6 | 0.912 | 82.0 |
| Ex-2 | 4.7 | 0.39 | 1.38 | 1.62 | 158.8 | 1.075 | 81.5 |
| Ex-3 | 5.4 | 0.40 | 1.79 | 1.71 | 158.5 | 1.118 | 82.1 |
| Ex-4 | 4.6 | 0.42 | 1.82 | 1.59 | 158.0 | 1.063 | 81.3 |
| Ex-5 | 4.3 | 0.50 | 1.69 | 1.43 | 157.8 | 1.167 | 80.6 |
| Ex-6 | 6.1 | 0.53 | 1.77 | 1.66 | 157.7 | 1.156 | 80.2 |
| Ex-7 | 5.5 | 0.51 | 1.76 | 1.65 | 158.1 | 1.133 | 80.7 |
| Ex-8 | 5.8 | 0.53 | 1.77 | 1.64 | 157.2 | 1.161 | 80.1 |
| Ex-9 | 5.5 | 0.41 | 1.25 | 1.82 | 158.3 | 1.141 | 81.0 |
| Ex-10 | 5.4 | 0.41 | 1.21 | 1.82 | 158.0 | 1.152 | 80.2 |
| Ex-11 | 5.5 | 0.47 | 1.86 | 1.35 | 157.1 | 1.158 | 80.0 |

TABLE 3-continued

| | | | | | | | |
|---|---|---|---|---|---|---|---|
| Ex-12 | 5.7 | 0.48 | 1.98 | 1.35 | 158.5 | 1.002 | 81.1 |
| CE-1 | 5.3 | 0.39 | 0.65 | 1.85 | 157.2 | 1.269 | 81.3 |
| CE-2 | 6.1 | 0.58 | 1.91 | 1.24 | 157.6 | 1.301 | 78.9 |
| CE-3 | 4.9 | 0.67 | 0.77 | 1.84 | 157.1 | 1.310 | 78.8 |
| CE-4 | 4.7 | 0.66 | 1.15 | 1.71 | 157.3 | 1.305 | 77.9 |

*In Example 12 the "Average ratio of the thickness in the radial direction of the inner-shell section and outer-shell section" is expressed.

EXPLANATION OF REFERENCE NUMBERS

1 Cathode (Electrode for evaluation)
2 Anode
3 Separator
4 Gasket
5 Cathode can
6 Anode can
B 2032 type coin battery

What is claimed is:

1. Transition metal composite hydroxide particles that are the precursor for cathode active material for a non-aqueous electrolyte rechargeable battery, comprising secondary particles that are formed by an aggregation of plate-shaped primary particles and fine primary particles that are smaller than the plate-shaped primary particles;
the secondary particles having a center section that is formed by an aggregation of the plate-shaped primary particles, and one layered structure of a low-density section that is formed by an aggregation of the fine primary particles and a high-density section that is formed by an aggregation of the plate-shaped primary particles on the outside of the center section;
the average value of the ratio of the center section outer diameter with respect to the particle size of the secondary particles being 30% to 80%, and the average value of the high-density section radial direction thickness with respect to the particle size of the secondary particles being 5% to 25%; and
the secondary particles having an average particle size of 1 μm to 15 μm, and an index [(d90 d10)/average particle size] that indicates the extent of the particle size distribution of 0.65 or less.

2. The transition metal composite hydroxide particles according to claim 1, wherein the transition metal composite hydroxide particles are transition metal composite hydroxide particles that are expressed by the general expression (A): $Ni_xMn_yCo_zM_t(OH)_{2+a}$, where, $x+y\ z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element that is selected from among Mg, Ca, Al, Ti, V, Cr, Zr, Nb, Mo, Hf, Ta and W).

3. The transition metal composite hydroxide particles according to claim 2, wherein the additional element is uniformly distributed inside the secondary particles and/or coated on the surface of the secondary particles.

4. Transition metal composite hydroxide particles that are the precursor for cathode active material for a non-aqueous electrolyte rechargeable battery, comprising secondary particles that are formed by an aggregation of plate-shaped primary particles and fine primary particles that are smaller than the plate-shaped primary particles;
the secondary particles having a center section that is formed by an aggregation of plate-shaped primary particles, and two or more layered structure of a low-density section that is formed by an aggregation of the fine primary particles and a high-density section that is formed by an aggregation of the plate-shaped primary particles on the outside of the center section; and
the secondary particles having an average particle size of 1 μm to 15 μm, and an index [(d90 d10)/average particle size] that indicates the extent of the particle size distribution of 0.65 or less.

5. The transition metal composite hydroxide particles according to claim 4, wherein the average value of the ratio of the center section outer diameter with respect to the particle size of the secondary particles is 20% to 70%, and the average value of the high-density section radial direction thickness per layer with respect to the particle size of the secondary particles is 5% to 25%.

6. A production method for producing the transition metal composite hydroxide particles of claim 1 by a crystallization reaction to be a precursor for a cathode active material for a non-aqueous electrolyte rechargeable battery, comprising:
a nucleation process for performing nucleation by controlling an aqueous solution for nucleation that includes a metal compound that includes at least a transition metal and an ammonium ion donor so that the pH value at a standard liquid temperature of 25° C. becomes 12.0 to 14.0; and
a particle growth process for causing nuclei to grow by controlling an aqueous solution for particle growth that includes the nuclei that were obtained in the nucleation process so that the pH value is less than in the nucleation process and is 10.5 to 12.0;
the reaction atmosphere in the nucleation process and at the beginning of the particle growth process being a non-oxidizing atmosphere in which an oxygen concentration is 5% by volume or less; and
in the particle growth process, atmosphere control by which the reaction atmosphere is switched from the non-oxidizing atmosphere to an oxidizing atmosphere in which the oxygen concentration is greater than 5% by volume at timing from the start of the particle growth process within a range of 5% to 35% of the overall particle growth process time, and is then switched from the oxidizing atmosphere to a non-oxidizing atmosphere in which the oxygen concentration is 5% by volume or less so that the crystallization time in the oxidizing atmosphere in the particle growth process is 3% to 20% of the overall particle growth process time being performed one time.

7. The production method for producing transition metal composite hydroxide particles according to claim 1, wherein the transition metal composite hydroxide particles are transition metal composite hydroxide particles that are expressed by the general expression (A): $Ni_xMn_yCo_zM_t(OH)_{2+a}$, where $x+y+z+t=1$, $0.3 \leq x \leq 0.95$, $0.05 \leq y \leq 0.55$, $0 \leq z \leq 0.4$, $0 \leq t \leq 0.1$, $0 \leq a \leq 0.5$, and M is one or more additional element that is selected from among Mg, Ca, Al, Ti, V, Cr, Zr, Nb, Mo, Hf, Ta and W.

8. The production method for producing transition metal composite hydroxide particles according to claim 7, further comprising a coating process for coating the transition metal composite hydroxide particles with a compound that includes the additional element M after the particle growth process.

9. A production method for producing cathode active material for a non-aqueous electrolyte rechargeable battery comprising:
a mixing process for forming a lithium mixture by mixing the transition metal composite hydroxide particles according to claim 1 with a lithium compound; and
a calcination process for performing calcination of the lithium mixture formed in the mixing process at a temperature of 650° C. to 980° C. in an oxidizing atmosphere.

10. The production method for producing cathode active material for a non-aqueous electrolyte rechargeable battery according to claim 9, wherein in the mixing process the lithium mixture is adjusted so that the ratio of the sum of the number of atoms of metals other than lithium included in the lithium mixture, and the number of atoms of lithium is 1:0.95 to 1.5.

11. The production method for producing cathode active material for a non-aqueous electrolyte rechargeable battery according to claim 10, further comprising a heat treatment process for heat treating the transition metal composite hydroxide particles at 105° C. to 750° C. before the mixing process.

12. The production method for producing cathode active material for a non-aqueous electrolyte rechargeable battery according to claim 9, wherein the cathode active material comprises layered hexagonal crystal lithium nickel manganese composite oxide particles that are expressed by the general expression (B): $Li_{1+u}Ni_xMn_yCo_zM_tO_2$, where $-0.05 \leq u \leq 0.50$, $x+y+z+t=1$, $0.3 \leq x \leq 0.95$, $0.05 \leq y \leq 0.55$, $0 \leq z \leq 0.4$, $0 \leq t \leq 0.1$, and M is one or more additional element that is selected from among Mg, Ca, Al, Ti, V, Cr, Zr, Nb, Mo, Hf, Ta and W.

13. A production method for producing the transition metal composite hydroxide particles of claim 4 by a crystallization reaction to be a precursor for a cathode active material for a non-aqueous electrolyte rechargeable battery, comprising:
a nucleation process for performing nucleation by controlling an aqueous solution for nucleation that includes a metal compound that includes at least a transition metal and an ammonium ion donor so that the pH value at a standard liquid temperature of 25° C. becomes 12.0 to 14.0; and
a particle growth process for causing nuclei to grow by controlling an aqueous solution for particle growth that includes the nuclei that were obtained in the nucleation process so that the pH value is less than in the nucleation process and is 10.5 to 12.0;
the reaction atmosphere in the nucleation process and at the beginning of the particle growth process being a non-oxidizing atmosphere in which the oxygen concentration is 5% by volume or less;
in the particle growth process, atmosphere control by which the reaction atmosphere is switched from the non-oxidizing atmosphere to an oxidizing atmosphere in which the oxygen concentration is greater than 5% by volume, and is then switched from that oxidizing atmosphere to a non-oxidizing atmosphere in which the oxygen concentration is 5% by volume or less being performed two times or more; and
the total crystallization reaction time in the oxidizing atmosphere in the particle growth process being 3% to 30% of the total particle growth process time, and the crystallization reaction time during each oxidizing atmosphere being 1% or more of the total particle growth process time.

14. The production method for producing transition metal composite hydroxide particles according to claim 13, wherein in the particle growth process, the reaction atmosphere is switched from the non-oxidizing atmosphere to the oxidizing atmosphere at timing from the start of the particle growth process within a range of 5% to 35% of the overall particle growth process time.

* * * * *